(12) United States Patent
Takeuchi

(10) Patent No.: US 8,253,131 B2
(45) Date of Patent: Aug. 28, 2012

(54) ORGANIC EL DISPLAY PANEL AND MANUFACTURING METHOD THEREOF

(75) Inventor: Takayuki Takeuchi, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/100,520

(22) Filed: May 4, 2011

(65) Prior Publication Data

US 2011/0272677 A1    Nov. 10, 2011

Related U.S. Application Data

(63) Continuation of application No. PCT/JP2010/003129, filed on May 7, 2010.

(51) Int. Cl.
*H01L 29/08*    (2006.01)
(52) U.S. Cl. ............................. 257/40; 438/82
(58) Field of Classification Search .............. 257/40; 438/82
See application file for complete search history.

(56) References Cited

U.S. PATENT DOCUMENTS

| | | | |
|---|---|---|---|
| 6,933,529 B2 | 8/2005 | Yoo et al. | |
| 7,888,867 B2 | 2/2011 | Yoshida et al. | |
| 2004/0142502 A1 | 7/2004 | Yoo et al. | |
| 2005/0116240 A1 | 6/2005 | Kim et al. | |
| 2005/0282308 A1 | 12/2005 | Uhlig et al. | |
| 2011/0180821 A1 | 7/2011 | Matsushima | |

FOREIGN PATENT DOCUMENTS

| | | |
|---|---|---|
| JP | 2004-096100 | 3/2004 |
| JP | 2004-152595 | 5/2004 |
| JP | 2005-158672 | 6/2005 |
| JP | 2006-114480 | 4/2006 |
| JP | 2007-061674 | 3/2007 |
| JP | 2008-112875 | 5/2008 |
| JP | 2009-247918 | 10/2009 |

OTHER PUBLICATIONS

U.S. Appl. No. 13/088,654 to Takayuki Takeuchi et al., which was filed Apr. 18, 2011.
U.S. Appl. No. 13/091,652 to Hideaki Matsushima, which was filed Apr. 21, 2011.
U.S. Appl. No. 13/091,667 to Hideaki Matsushima, which was filed Apr. 21, 2011.
International Search Report in PCT/JP2010/003129, dated Aug. 6, 2010.

*Primary Examiner* — Douglas Menz
(74) *Attorney, Agent, or Firm* — Greenblum & Bernstein, P.L.C.

(57) ABSTRACT

An organic EL display panel includes pixels and an interlayer insulation film on a thin film transistor layer. The interlayer insulation film includes contact holes which each correspond to one of the pixels. A bank is a grid that defines apertures. One of the contact holes is beneath each of the apertures. A first organic light-emitting layer is disposed in each of the apertures that corresponds to one of the pixels of a first color. A second organic light-emitting layer is disposed in each of the apertures that corresponds to one of the pixels of a second color. In each of the apertures in which one of the first and second organic light-emitting layers is disposed, a contact hole region is above the contact hole. A first-material layer comprising a same material as the first organic light-emitting layer and a second-material layer comprising a same material as the second organic light-emitting layer are superimposed in each contact hole region.

26 Claims, 20 Drawing Sheets

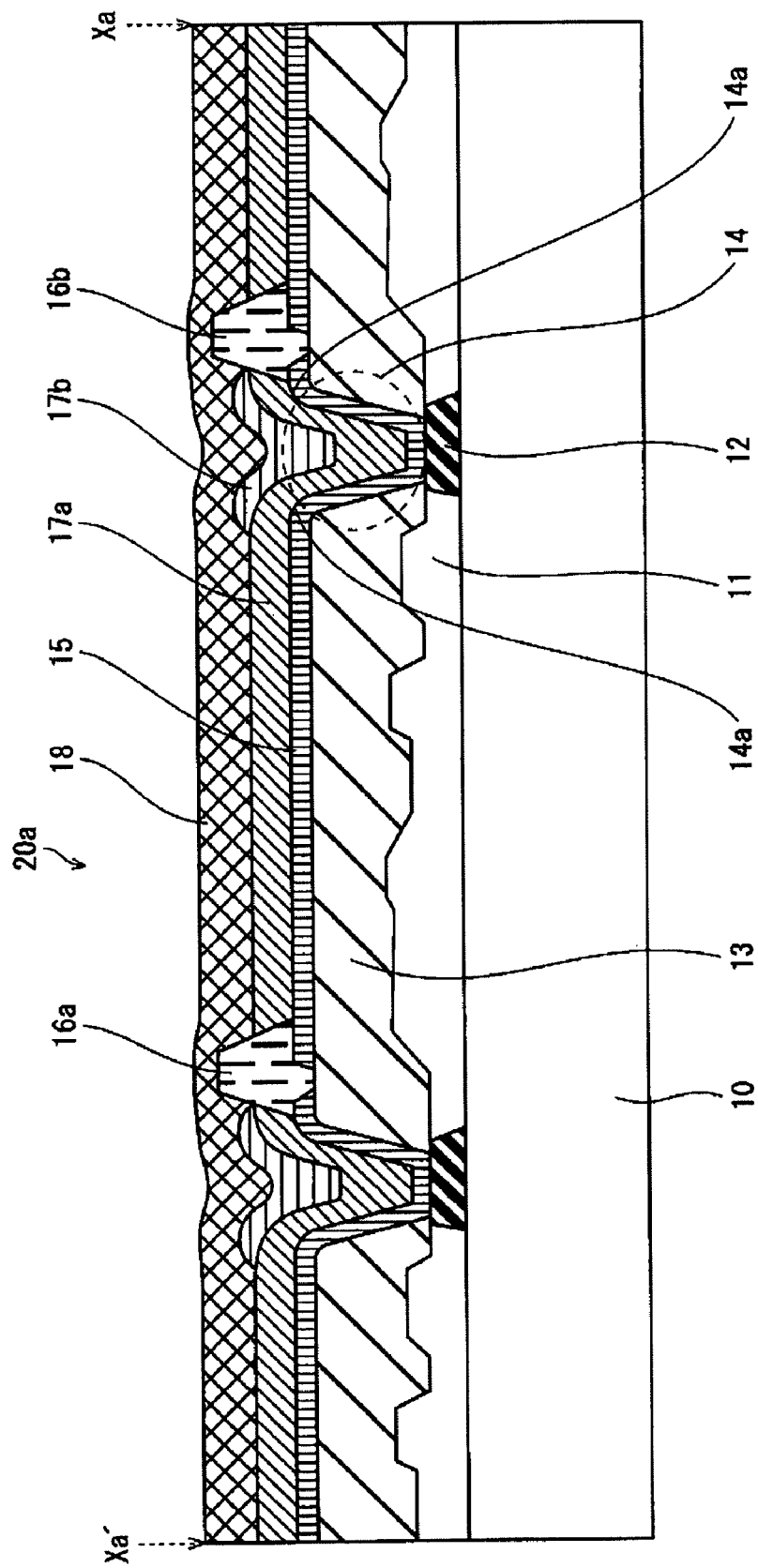

ORGANIC EL DISPLAY PANEL AND MANUFACTURING METHOD THEREOF

CROSS REFERENCE TO RELATED APPLICATION

This is a continuation application of PCT Application No. PCT/JP10/003,129 filed May 7, 2010, designating the United States of America, the disclosure of which, including the specification, drawings and claims, is incorporated herein by reference in its entirety.

BACKGROUND OF THE INVENTION

1. Field of the Invention

The present invention relates to an organic EL display panel, and in particular to technology for improving aperture ratio.

2. Description of the Related Art

In recent years, research and development has progressed in the area of organic electroluminescence (hereinafter "organic EL") display panels that use the phenomenon of electroluminescence of organic material. Each organic EL cell composing an organic EL display panel is composed of an anode, a cathode, and an organic light-emitting layer provided therebetween. The anode is layered on an interlayer insulation film that is layered on a Thin Film Transistor (TFT) substrate for driving the cells. To connect the anode with an electrode of the TFT, a through-hole (contact hole) is provided in the direction of thickness of the interlayer insulation film. So that the contact hole will not emit light, the contact hole is buried under the bank. However, such a structure hinders improvement of aperture ratio, which prevents an increase in the light-emitting surface area in an organic EL display panel and prevents improvement of luminous efficiency (see Patent Literature 1).

PATENT LITERATURES

[Patent Literature 1] Japanese Patent Application Publication No. 2007-61674

SUMMARY OF INVENTION

In order to improve aperture ratio, a contact hole that is buried under a conventional bank may simply be provided within an aperture surrounded by the bank. However, in such a structure, the organic light-emitting layer becomes concave in conformity with the recess of the contact hole. In this case, although light-emitting material used in the organic light-emitting layer is viscous, the light-emitting material flows towards the bottom surface of the contact hole due to gravity. As a result, the organic light-emitting layer becomes thinner along the slanted surface that extends from the upper periphery of the contact hole to the bottom surface of the contact hole, in particular around the upper periphery of the contact hole. In the region where the film becomes thinner, the distance between the anode and the cathode becomes shorter than other regions. This results in irregular light emission due to concentration of the electric field, which causes the problem of shortening the lifetime of the organic EL display panel.

In light of the above problems, it is an object of the present invention to provide an organic EL display panel that improves luminous efficiency by providing contact holes within apertures in the bank to improve the aperture ratio, and that can also prevent shortening of the display panel's lifetime by not causing concentration of the electric field.

In order to solve the above problems, an organic EL display panel according to an aspect of the present invention comprises a TFT layer; an interlayer insulation film formed on the TFT layer and including a plurality of contact holes, one per pixel; a plurality of first electrodes, one per pixel, formed on the interlayer insulation film so as to conduct with the TFT layer via the contact holes; a bank formed into a grid with a plurality of apertures, at least one per color, and one or more of the contact holes being located beneath each aperture; a first organic light-emitting layer formed in each aperture corresponding to one or more pixels of a first color; a second organic light-emitting layer formed in each aperture corresponding to one or more pixels of a second color; and a second electrode formed above the first organic light-emitting layer and the second organic light-emitting layer, wherein at each aperture in which the first organic light-emitting layer is formed, each contact hole and a region thereabove constitutes a first contact hole region, at each aperture in which the second organic light-emitting layer is formed, each contact hole and a region thereabove constitutes a second contact hole region, and a first-material layer of a same material as the first organic light-emitting layer and a second-material layer of a same material as the second organic light-emitting layer are superimposed in the first contact hole region and the second contact hole region.

In an organic EL display panel according to an aspect of the present invention with the above structure, the aperture formed for each pixel within the bank is formed to include the contact hole, which thereby enlarges the aperture and increases aperture ratio. This increases the light-emitting surface area and improves luminous efficiency. Specifically, in the contact hole region in the apertures, in addition to an organic light-emitting layer of one of three colors, an organic light-emitting layer of one of the other two colors is superimposed, making the film thickness of the contact hole region thicker than the organic light-emitting layer formed in a region of the aperture other than the contact hole region. This prevents concentration of the electric field along the slanted surface that extends from the upper periphery of the contact hole to the bottom surface of the contact hole, in particular around the upper periphery of the contact hole.

Furthermore, since the film thickness of the organic light-emitting layer formed in the contact hole region in the apertures is thicker than the organic light-emitting layer formed in the region other than the contact hole region in the apertures, the electric field is smaller as compared to the region other than the contact hole region. Accordingly, while the organic light-emitting layer emits light in the region other than the contact hole region, the organic light-emitting layer either does not emit light in the contact hole region or emits light at a lower luminance than in the region other than the contact hole region. However, the contact hole region occupies only a very small area within the aperture, and therefore even if the contact hole region does not emit light, or emits light at a low luminance, there is little overall effect on the aperture as a whole. Thus a problem of an overall decrease in luminescence brightness does not occur. Therefore, by including the contact hole beneath the aperture formed for each pixel within the bank and increasing the aperture ratio, luminescence brightness can be increased.

BRIEF DESCRIPTION OF THE DRAWINGS

FIG. 2 is a cross-section diagram schematically showing a cross-section of an organic EL display panel according to Embodiment 1 of the present invention, focusing on an organic EL cell of a first color.

DESCRIPTION OF THE PREFERRED EMBODIMENT(S)

1. Aspects of the Invention

Figure 1:
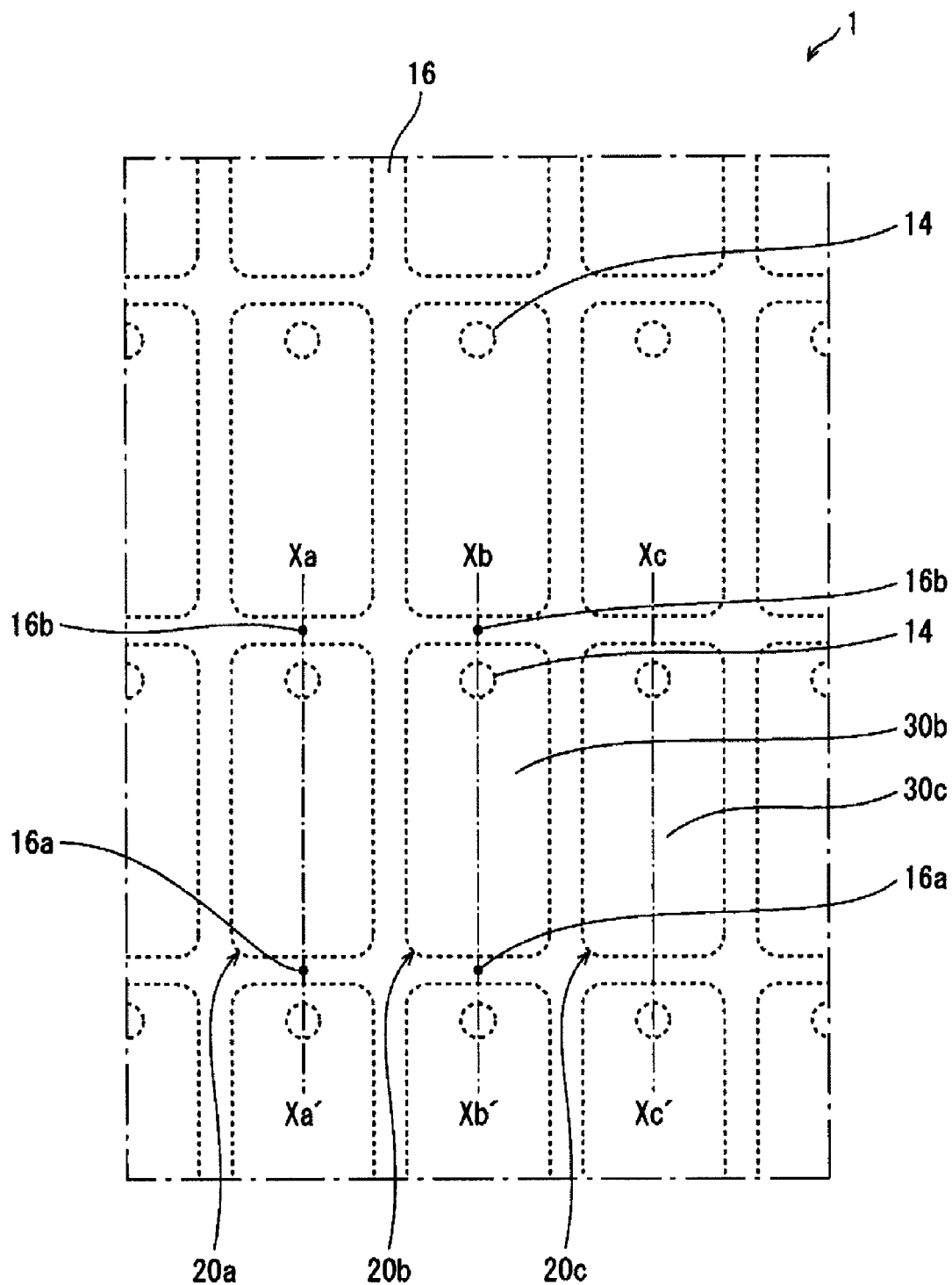
FIG. 1 is a plan view schematically showing part of an organic EL display panel according to Embodiment 1 of the present invention.

An organic EL display panel according to an aspect of the present invention comprises a TFT layer; an interlayer insulation film formed on the TFT layer and including a plurality of contact holes, one per pixel; a plurality of first electrodes, one per pixel, formed on the interlayer insulation film so as to conduct with the TFT layer via the contact holes; a bank formed into a grid with a plurality of apertures, at least one per color, and one or more of the contact holes being located beneath each aperture; a first organic light-emitting layer formed in each aperture corresponding to one or more pixels of a first color; a second organic light-emitting layer formed in each aperture corresponding to one or more pixels of a second color; and a second electrode formed above the first organic light-emitting layer and the second organic light-emitting layer, wherein at each aperture in which the first organic light-emitting layer is formed, each contact hole and a region thereabove constitutes a first contact hole region, at each aperture in which the second organic light-emitting layer is formed, each contact hole and a region thereabove constitutes a second contact hole region, and a first-material layer of a same material as the first organic light-emitting layer and a second-material layer of a same material as the second organic light-emitting layer are superimposed in the first contact hole region and the second contact hole region.

The second-material layer may be superimposed on the first-material layer in the first contact hole region and the second contact hole region.

In this aspect, the relative positions of the second-material layer and the first-material layer in the contact hole regions can be defined.

At each aperture in which the first organic light-emitting layer is formed, a film thickness in the first contact hole region, in which the second-material layer is superimposed, may be thicker than a film thickness of the first organic light-emitting layer formed in a region other than the first contact hole region. At each aperture in which the second organic light-emitting layer is formed, a film thickness in the second contact hole region, in which the first-material layer is superimposed, may be thicker than a film thickness of the second organic light-emitting layer formed in a region other than the second contact hole region.

In this aspect, the organic light-emitting layer in the contact hole region, in which a plurality of colors are superimposed, is thicker than the film thickness in the region other than the contact hole region. Therefore, in the contact hole region in which a plurality of colors are superimposed, the electric field is smaller as compared to the region other than the contact hole region, so that light is emitted in the region other than the contact hole region, whereas in the contact hole region, either luminance decreases, or light is not emitted. However, the contact hole region occupies only a very small area within the aperture, and therefore even if the contact hole region does not emit light, or emits light at a low luminance, there is little overall effect on the aperture as a whole. Thus a problem of an overall decrease in luminescence brightness does not occur. Therefore, by including the contact hole beneath the aperture formed for each pixel within the bank and increasing the aperture ratio, luminescence brightness can be increased.

The organic EL display panel may further comprise a third organic light-emitting layer formed in each aperture corresponding to one or more pixels of a third color. The second electrode may be formed above the first organic light-emitting layer, the second organic light-emitting layer, and the third organic light-emitting layer. At each aperture in which the third organic light-emitting layer is formed, each contact hole and a region thereabove constitutes a third contact hole region, and the first-material layer, the second-material layer, and a third-material layer of a same material as the third organic light-emitting layer may be superimposed in the first contact hole region, the second contact hole region, and the third contact hole region.

In this aspect, the organic light-emitting layer included in each pixel can be formed using organic light-emitting layers that emit red, green, and blue light.

The second-material layer may be superimposed on the first-material layer, and the third-material layer may be superimposed on the second-material layer, in the first contact hole region, the second contact hole region, and the third contact hole region.

In this aspect, the relative positions of the third-material layer, the second-material layer, and the first-material layer in the contact hole regions can be defined.

At each aperture in which the first organic light-emitting layer is formed, a film thickness in the first contact hole region, in which the first-material layer, the second-material layer, and the third-material layer are superimposed, may be thicker than a film thickness of the first organic light-emitting layer formed in a region other than the first contact hole region. At each aperture in which the second organic light-emitting layer is formed, a film thickness in the second contact hole region, in which the first-material layer, the second-material layer, and the third-material layer are superimposed, may be thicker than a film thickness of the second organic light-emitting layer formed in a region other than the second contact hole region. At each aperture in which the third organic light-emitting layer is formed, a film thickness in the third contact hole region, in which the first-material layer, the second-material layer, and the third-material layer are superimposed, may be thicker than a film thickness of the third organic light-emitting layer formed in a region other than the third contact hole region.

In this aspect, in each of the pixels that respectively emit red, green, and blue light, the organic light-emitting layer included in the contact hole region, in which a plurality of colors are superimposed, has a thicker film thickness than a region other than the contact hole. Therefore, in the contact hole region in which a plurality of colors are superimposed, the electric field is smaller as compared to the region other than the contact hole region, so that light is emitted in the region other than the contact hole region, whereas in the contact hole region, either luminance decreases, or light is not emitted. However, the contact hole region occupies only a very small area within the aperture, and therefore even if the contact hole region does not emit light, or emits light at a low luminance, there is little overall effect on the aperture as a whole. Thus a problem of an overall decrease in luminescence brightness does not occur. Therefore, by including the contact hole beneath the aperture formed for each pixel within the bank and increasing the aperture ratio, luminescence brightness can be increased.

The bank may be formed into a grid with a plurality of apertures formed in lines for each color.

In this aspect, the aperture for each pixel formed in the line bank is formed to include the contact holes, which thereby enlarges the apertures and increases aperture ratio. This increases the light-emitting surface area and improves luminous efficiency.

The bank may be formed into a grid with a plurality of apertures, each aperture corresponding to one pixel, to one color, and to one of the first electrodes.

In this aspect, the aperture for each pixel formed in the pixel bank is formed to include the contact hole, which thereby enlarges the apertures and increases aperture ratio. This increases the light-emitting surface area and improves luminous efficiency.

The first color and the second color may each be one of red, green, and blue.

In this aspect, the first color and the second color can each be one of red, green, and blue.

The first color, the second color, and the third color may be different colors. The first color, the second color, and the third color may each be one of red, green, and blue.

In this aspect, the first color, the second color, and the third color are different colors, and each can be one of red, green, and blue.

The interlayer insulation film may be a planarizing film.

In this aspect, unevenness in the surface of the TFT layer can be planarized.

An organic EL display device according to the present invention comprises the above-described organic EL display panel.

In this aspect, an organic EL display device provided with the organic EL display panel can be achieved.

A manufacturing method of an organic EL display panel according to the present invention comprises the steps of: a first step to form a TFT layer; a second step to form an interlayer insulation film on the TFT layer; a third step to form a plurality of contact holes, one per pixel, in the interlayer insulation film; a fourth step to form a plurality of first electrodes on the interlayer insulation film, so as to conduct with the TFT layer via the contact holes; a fifth step to form a bank into a grid with a plurality of apertures, at least one per color, and one or more of the contact holes being located beneath each aperture; a sixth step to form a first organic light-emitting layer in each aperture corresponding to one or more pixels of a first color; a seventh step to form a second organic light-emitting layer in each aperture corresponding to one or more pixels of a second color; and an eighth step to form a second electrode above the first organic light-emitting layer and the second organic light-emitting layer, wherein at each aperture, each contact hole and a region thereabove constitutes a contact hole region, and a first-material layer of a same material as the first organic light-emitting layer and a second-material layer of a same material as the second organic light-emitting layer are superimposed in the contact hole region.

In this aspect, in the contact hole region included in the aperture in which the organic light-emitting layer of one of the three colors is formed, an organic light-emitting layer of one of the other two colors is superimposed. Accordingly, the organic light-emitting layer formed in the contact hole region can be formed to a thick film thickness, thus making it possible to manufacture an organic EL display panel that prevents the occurrence of concentration of the electric field along the slanted surface that extends from the upper periphery of the contact hole to the bottom surface of the contact hole.

Furthermore, since the film thickness of the organic light-emitting layer formed in the contact hole region in the apertures is thicker than the organic light-emitting layer formed in the region other than the contact hole region in the apertures, the electric field is smaller as compared to the region other than the contact hole region. Accordingly, while the organic light-emitting layer emits light in the region other than the contact hole region, the organic light-emitting layer either does not emit light in the contact hole region or emits light at a lower luminance than in the region other than the contact hole region. However, the contact hole region occupies only a very small area within the aperture, and therefore even if the contact hole region does not emit light, or emits light at a low luminance, there is little overall effect on the aperture as a whole. Thus a problem of an overall decrease in luminescence brightness does not occur. Therefore, by including the contact hole beneath the aperture formed for each pixel within the bank and increasing the aperture ratio, luminescence brightness can be increased.

The second-material layer may be superimposed on the first-material layer.

In this aspect, the relative positions of the second-material layer and the first-material layer in the contact hole regions can be defined.

At each aperture in which the first organic light-emitting layer is formed, a film thickness in the contact hole region, in which the second-material layer is superimposed, may be thicker than a film thickness of the first organic light-emitting layer formed in a region other than the contact hole region. At each aperture in which the second organic light-emitting layer is formed, a film thickness in the contact hole region, in which the first-material layer is superimposed, may be thicker than a film thickness of the second organic light-emitting layer formed in a region other than the contact hole region.

In this aspect, the organic light-emitting layer in the contact hole region, in which a plurality of colors are superimposed, is thicker than the film thickness in the region other than the contact hole region. Therefore, in the contact hole region in which a plurality of colors are superimposed, the electric field is smaller as compared to the region other than the contact hole region, so that light is emitted in the region other than the contact hole region, whereas in the contact hole region, either luminance decreases, or light is not emitted. However, the contact hole region occupies only a very small area within the aperture, and therefore even if the contact hole region does not emit light, or emits light at a low luminance, there is little overall effect on the aperture as a whole. Thus a problem of an overall decrease in luminescence brightness does not occur. Therefore, a manufacturing method of an organic EL display panel that increases luminescence brightness can be achieved by including the contact hole beneath the aperture formed for each pixel within the bank and increasing the aperture ratio.

An ink-jet method may be used to form the first organic light-emitting layer in the sixth step and the second organic light-emitting layer in the seventh step.

In this aspect, the ink jet method can be used to form the first organic light-emitting layer in the sixth step and the second organic light-emitting layer in the seventh step. With the ink-jet method, ink that includes the organic EL light-emitting material can be dripped to a high degree of precision in predetermined locations of pixels, such as the contact hole. Therefore, the light-emitting layers can be formed without using additional material or manufacturing processes, such as a mask.

In the sixth step, ink including an organic light-emitting material of the first color may be dripped into the contact hole included beneath each aperture corresponding to one or more pixels of the second color. In the seventh step, ink including an organic light-emitting material of the second color may be dripped into the contact hole included beneath each aperture corresponding to one or more pixels of the first color.

In this aspect, in order to superimpose an organic light-emitting layer of a different color in the contact hole region included in the aperture in which the organic light-emitting layer of a certain color is formed, a new, separate process is not necessary. Rather, it suffices to use an existing process, in which the ink-jet head that applies ink with the organic light-emitting material of a certain color passes over the contact holes included in apertures corresponding to pixels of different colors. Therefore, even when aperture ratio is increased by including contact holes within apertures defined by the bank, an extremely simple process that makes use of an existing process can be employed to increase luminous efficiency while preventing the occurrence of concentration of the electric field in contact holes.

After ink including an organic light-emitting material of the first color is dripped into the contact hole included beneath each aperture corresponding to one or more pixels of the second color in the sixth step, and before the seventh step, the ink including an organic light-emitting material of the first color may be dried, the seventh step being performed after drying.

In this aspect, the film of ink that includes organic light-emitting material of the first color is dried to form the solid film of the first organic light-emitting layer, and in the seventh step, ink that includes the organic light-emitting material of the second color is coated on the first organic light-emitting layer that has turned into the solid film. As a result, the ink used in the first organic light-emitting layer, which has turned into a solid film, and the ink that includes the organic light-emitting material of the second color do not mix with each other.

The organic light-emitting material in the first organic light-emitting layer is thus prevented from mixing with the organic light-emitting material of the second color.

The manufacturing method may further comprise a ninth step, between the seventh step and the eighth step, to form a third organic light-emitting layer in each aperture corresponding to one or more pixels of a third color. In the eighth step, the second electrode may be formed above the first organic light-emitting layer, the second organic light-emitting layer, and the third organic light-emitting layer. The first-material layer, the second-material layer, and a third-material layer of a same material as the third organic light-emitting layer may be superimposed in the contact hole region included at each aperture in which the first organic light-emitting layer is formed, the contact hole region included at each aperture in which the second organic light-emitting layer is formed, and the contact hole region included at each aperture in which the third organic light-emitting layer is formed.

In this aspect, an organic EL display panel can be manufactured such that the colors of the organic light-emitting layers included in the pixels are the three colors of light emitted by pixels: red, green, and blue.

At each aperture in which the first organic light-emitting layer is formed, a film thickness in the contact hole region, in which the first-material layer, the second-material layer, and the third-material layer are superimposed, may be formed to be thicker than a film thickness of the first organic light-emitting layer formed in a region other than the contact hole region. At each aperture in which the second organic light-emitting layer is formed, a film thickness in the contact hole region, in which the first-material layer, the second-material layer, and the third-material layer are superimposed, may be formed to be thicker than a film thickness of the second organic light-emitting layer formed in a region other than the contact hole region. At each aperture in which the third organic light-emitting layer is formed, a film thickness in the contact hole region, in which the first-material layer, the second-material layer, and the third-material layer are superimposed, may be formed to be thicker than a film thickness of the third organic light-emitting layer formed in a region other than the contact hole region.

In this aspect, a manufacturing method can be achieved for an organic EL display panel in which the colors of the organic light-emitting layers included in the pixels are the three colors of light emitted by pixels, i.e. red, green, and blue, and which increases luminous efficiency while preventing the occurrence of concentration of the electric field in contact holes.

An ink-jet method may be used to form the first organic light-emitting layer in the sixth step, the second organic light-emitting layer in the seventh step, and the third organic light-emitting layer in the eighth step.

In this aspect, the ink-jet method can be used to form the first organic light-emitting layer in the sixth step, the second organic light-emitting layer in the seventh step, and the third organic light-emitting layer in the eighth step. With the ink-jet method, ink that includes the organic EL light-emitting material can be dripped to a high degree of precision in predetermined locations of pixels, such as the contact hole. Therefore, the light-emitting layers can be formed without using additional material or manufacturing processes, such as a mask.

In the sixth step, ink including an organic light-emitting material of the first color may be dripped into the contact hole included beneath each aperture corresponding to one or more pixels of the second color, and ink including an organic light-emitting material of the first color may be dripped into the contact hole included beneath each aperture corresponding to one or more pixels of the third color. In the seventh step, ink including an organic light-emitting material of the second color may be dripped into the contact hole included beneath each aperture corresponding to one or more pixels of the first color, and ink including an organic light-emitting material of the second color may be dripped into the contact hole included beneath each aperture corresponding to one or more pixels of the third color. In the eighth step, ink including an organic light-emitting material of the third color may be dripped into the contact hole included beneath each aperture corresponding to one or more pixels of the first color, and ink including an organic light-emitting material of the third color may be dripped into the contact hole included beneath each aperture corresponding to one or more pixels of the second color.

In this aspect, when the ink jet head that applies ink with the organic light-emitting material of the first color passes over a contact hole included in an aperture corresponding to one or more pixels of the second color among the plurality of apertures, the ink jet head applies ink with the organic light-emitting material of the first color in the contact hole included in the aperture corresponding to the pixel of the second color. Furthermore, when the ink-jet head that applies ink with the organic light-emitting material of the first color passes over a contact hole included in an aperture corresponding to one or more pixels of the third color among the plurality of apertures, the ink jet head applies ink with the organic light-emitting material of the first color in the contact hole included in the aperture corresponding to the pixel of the third color.

Accordingly, in order to superimpose an organic light-emitting layer of two out of three colors in a contact hole region included in an aperture in which an organic light-emitting layer of the other of the three colors is formed, a new, separate process is not necessary. Rather, it suffices to use an existing process, in which the ink-jet head that sprays ink with the organic light-emitting material of a certain color passes over the contact holes included in apertures corresponding to pixels of different colors. Therefore, even when aperture ratio is increased by including contact holes within apertures defined by the bank, an extremely simple process that makes use of an existing process can be employed to increase luminous efficiency while preventing the occurrence of concentration of the electric field in contact holes.

The bank may be formed into a grid with a plurality of apertures formed in lines for each color.

In this aspect, the bank can have a plurality of apertures formed in lines for each color.

The bank may be formed into a grid with a plurality of apertures, each aperture corresponding to one pixel, to one color, and to one of the first electrodes.

In this aspect, the bank can have a plurality of apertures, each aperture corresponding to one pixel, to one color, and to one of the first electrodes.

The first color and the second color may each be one of red, green, and blue.

In this aspect, the first color and the second color can each be one of red, green, and blue.

The first color, the second color, and the third color may be different colors. The first color, the second color, and the third color may each be one of red, green, and blue.

In this aspect, the first color, the second color, and the third color are different colors, and each can be one of red, green, and blue.

2. Embodiment 1

Overall Configuration

FIG. 1 is a plan view schematically showing part of an organic EL display panel according to Embodiment 1 of the present invention.

The organic EL display panel 1 is formed by a plurality of top-emission type organic EL cells 20 arranged in a matrix. Each organic EL cell 20 is provided with a light-emitting layer corresponding to one of R (red), G (green), or B (blue). Each organic EL cell 20 corresponds to one pixel. An aperture 30 (hereinafter, the apertures 30 corresponding to R, G, and B are respectively referred to as aperture 30a, aperture 30b, and aperture 30c) for each organic EL cell 20 (hereinafter, the organic EL cells 20 corresponding to R, G, and B are respectively referred to as organic EL cell 20a, organic EL cell 20b, and organic EL cell 20c) is defined by a bank 16 that has a pixel bank (grid-shaped bank) structure.

FIG. 2 is a cross-section diagram schematically showing a cross-section (between Xa and Xa' in FIG. 1) of an organic EL display panel, focusing on the organic EL cell 20a.

The substrate 10 is formed with an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc.

A Thin Film Transistor (TFT) layer 11 having power supply electrodes 12 is formed on the substrate 10, and an interlayer insulation film 13 is formed above the TFT layer 11.

The interlayer insulation film 13 is formed with an organic material having excellent insulating properties and is approximately 4 µm (micrometers) thick. Through-holes (contact holes 14) are formed in the direction of thickness of the interlayer insulation film 13.

<Contact Holes>

Figure 3A:
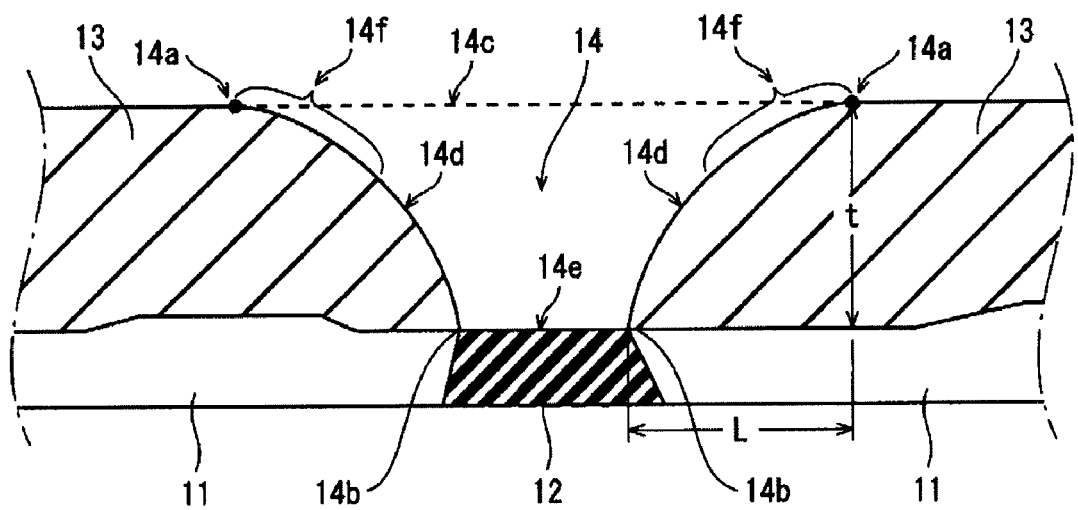
FIGS. 3A and 3B show a contact hole in an organic EL cell according to Embodiment 1 of the present invention.
Figure 3B:
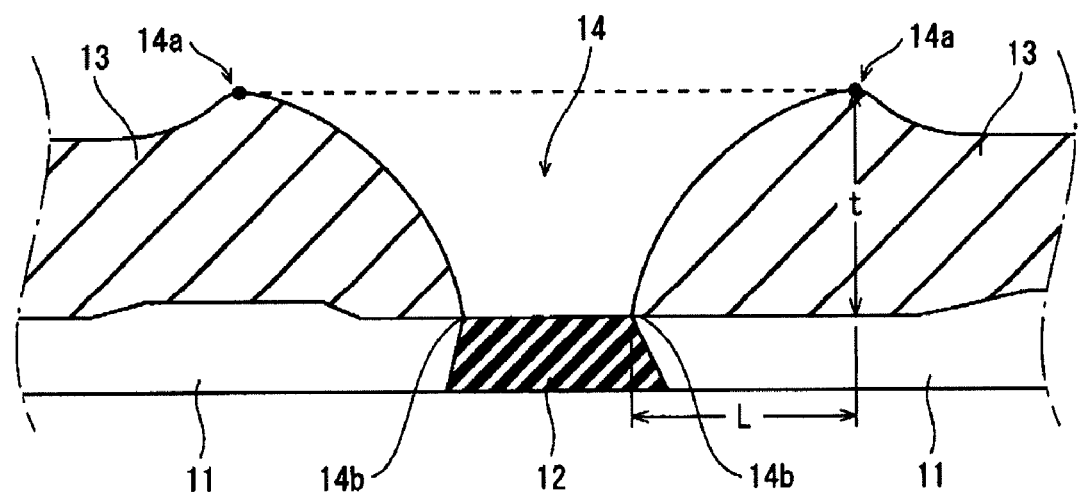
Figure 4:
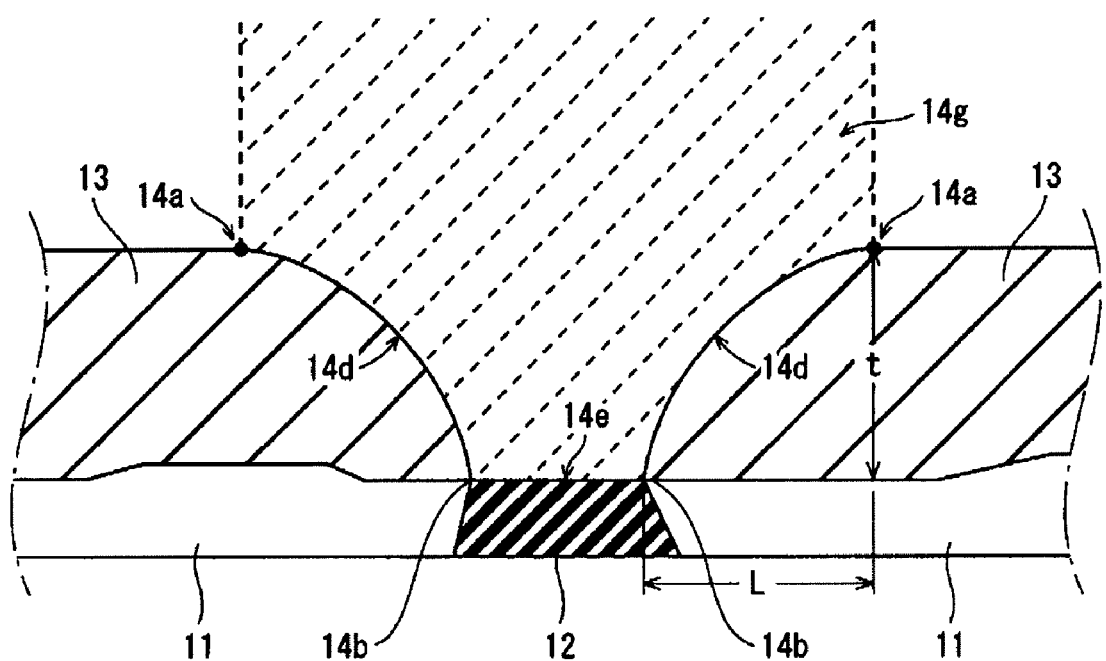
FIG. 4 shows a contact hole in an organic EL cell according to Embodiment 1 of the present invention (continued from FIGS. 3A and 3B).

The following is a detailed description of the contact holes 14 with reference to FIGS. 3 and 4.

FIGS. 3A and 3B are enlarged drawings of a contact hole 14 in FIG. 2. For the sake of explanation, only the TFT layer 11, power supply electrode 12, interlayer insulation film 13, and contact hole 14 are shown.

The contact hole 14 refers to a space surrounded by a contact hole upper surface 14c, contact hole slanted surface 14d, and contact hole bottom surface 14e shown in FIG. 3A. Note that the contact hole 14 as described above is a through-hole, and the contact hole upper surface 14c and contact hole bottom surface 14e are imaginary surfaces for the sake of explanation.

The contact hole upper surface 14c is a section surrounded by a roughly annular contact hole upper periphery 14a. A film thickness of the interlayer insulation film 13 increases upwards from the contact hole bottom surface 14e along the contact hole slanted surface 14d, and the contact hole upper periphery 14a is the section where the film thickness reaches a maximum. Since it is preferable that the space occupied by the contact hole upper surface 14c within the upper surface of the interlayer insulation film 13 be as small as possible, it is preferable that the inclination angle of the contact hole slanted surface 14d be large. However, an inclination angle that is too large (near 90 degrees) causes the problem of disconnection, due to a step, in the electrical conduction that should exist between the TFT layer 11 and the first electrode 15. Conversely, if the inclination angle of the contact hole slanted surface 14d becomes smaller and smaller, this causes a problem in that a region in which a predetermined film thickness cannot be achieved grows larger, the predetermined film thickness being determined by the surface of parasitic capacitance produced between the first electrode 15 and the TFT source electrode, drain electrode, gate electrode, signal wiring, power line, etc. Considering these problems, it is preferable that a film thickness t of the interlayer insulation film 13 at the contact hole upper periphery 14a and a surface distance L between the contact hole lower periphery 14b and the contact hole upper periphery 14a in FIG. 3A satisfy the expression L<3t. However, the film thickness t and surface distance L are not limited to this relationship.

Note that, as shown in FIG. 3B, even if the film thickness of the interlayer insulation film 13 increases upwards from the contact hole bottom surface 14e along the contact hole slanted surface 14d, and after the film thickness reaches its maximum, the film thickness begins to decrease, the contact hole upper periphery 14a is still the section where the film thickness of the interlayer insulation film 13 reaches its maximum, as in FIG. 3A.

Also, the inner region near the contact hole upper periphery 14a referred to below designates a section labeled as 14f in FIG. 3A.

Furthermore, a region indicated with a dashed diagonal line in FIG. 4, i.e. the contact hole 14 and an area above the contact hole 14, is referred to as a contact hole region 14g.

This concludes a supplementary description of the contact hole 14. The description now returns to FIG. 2.

<Structure of Organic EL Cell 20>

A first electrode 15, which is an anode, is layered on the interlayer insulation film 13. The first electrode 15 is electrically connected to the power supply electrode 12 in the TFT layer 11 via the contact hole 14.

The first electrode 15 is formed with Ag (silver). Note that the first electrode 15 may be formed with APC (alloy of silver, palladium, and copper), ARA (alloy of silver, rubidium, and gold), MoCr (alloy of molybdenum and chromium), NiCr (alloy of nickel and chromium), Al (aluminum), an Al alloy, etc. In the case of a top emission type light-emitting element, it is preferable that the first electrode 15 be formed with a light-reflective material.

The bank 16 (bank 16a, bank 16b, . . . ) is formed above the interlayer insulation film 13 and the power supply electrode 12. The bank 16 is formed with an organic material, such as resin, and has insulating properties. Examples of the organic material include acrylic resin, polyimide resin, novolac-type phenolic resin, etc. It is preferable that the bank 16 have organic solvent resistance. Furthermore, since the bank 16 is etched, baked, etc. when formed, it is preferable that the bank 16 be formed from highly resistant material that will not change excessively in shape or quality during the etching and baking processes.

In regions partitioned by the bank 16, an organic light emitting layer 17a corresponding to R (red) (hereinafter, simply "light-emitting layer") is layered.

It is preferable that the light-emitting layer 17a be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The light-emitting layer 17a enters into the recess formed by the contact hole 14, becoming concave in conformity with the recess. If the light-emitting layer 17a is simply formed by conventional means, the film thickness of the light-emitting layer 17a formed at the contact hole slanted surface 14d, in particular at the inner region 14f near the contact hole upper periphery 14a (see FIG. 3A), becomes thinner than at other regions. Concentration of the electric field is produced at this region where the film thickness is thin. However, in Embodiment 1, a light-emitting layer 17b corresponding to G (green) is further layered on the light-emitting layer 17a. The total film thickness of the light-emitting layer 17a and the light-emitting layer 17b layered on the contact hole region 14g should be thicker than the film thickness of the light-emitting layer 17a layered in a region other than the contact hole region 14g. Normally, the film thickness of the light-emitting layer 17b is preferably on the order of 5-100 nm. Hereinafter, the light-emitting layers 17a, 17b, . . . , formed in each organic EL cell 20 in a region defined by the bank, are collectively designated as a light-emitting layer 17.

A second electrode 18, which is a cathode, is layered on the light-emitting layer 17.

The second electrode 18 is formed, for example, of ITO, indium zinc oxide (IZO), etc. In the case of a top-emission type organic EL cell, it is preferable that the second electrode 18 be formed with a transparent material.

Note that, while not shown in the figures, a widely-known passivation layer is provided above the second electrode 18. The passivation layer is formed, for example, with silicon nitride (SiN), silicon oxynitride (SiON), etc., and controls the light-emitting layer 17 from deteriorating due to exposure to water, air, etc. In the case of a top-emission type organic EL cell, it is preferable that the passivation layer also be formed with a transparent material.

Next, the structure of the organic EL cell 20b corresponding to G is described.

Figure 5:
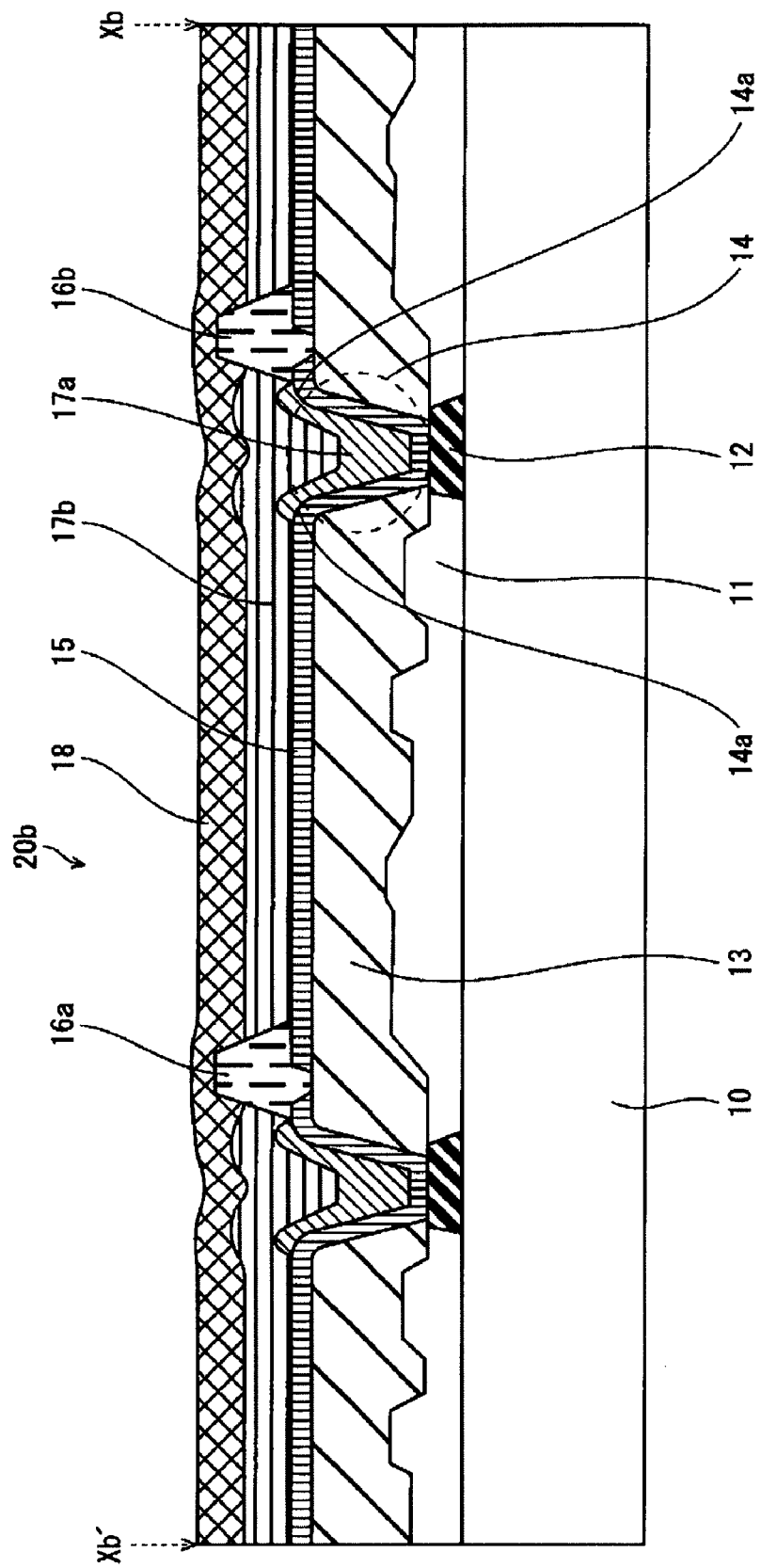
FIG. 5 is a cross-section diagram schematically showing a cross-section of an organic EL display panel according to Embodiment 1 of the present invention, focusing on an organic EL cell of a second color.

As shown in FIG. 5, the organic EL cell 20b differs from the organic EL cell 20a in that the light-emitting layer 17a is formed only in the contact hole region 14g, whereas the light-emitting layer 17b is formed in a region other than the contact hole region 14g.

Furthermore, while not shown in the figures, the structure of the organic EL cell 20c corresponding to B is the same as the organic EL cell 20b, replacing the light-emitting layer 17b with the light-emitting layer 17c, which corresponds to B.

Note that in each organic EL cell 20, in addition to the emission color of the cell's light-emitting layer, a light-emitting layer of a different emission color is also provided; this light-emitting layer of a different emission color may be any emission color.

Advantageous Effects of the Structure in Embodiment 1

Figure 6C:
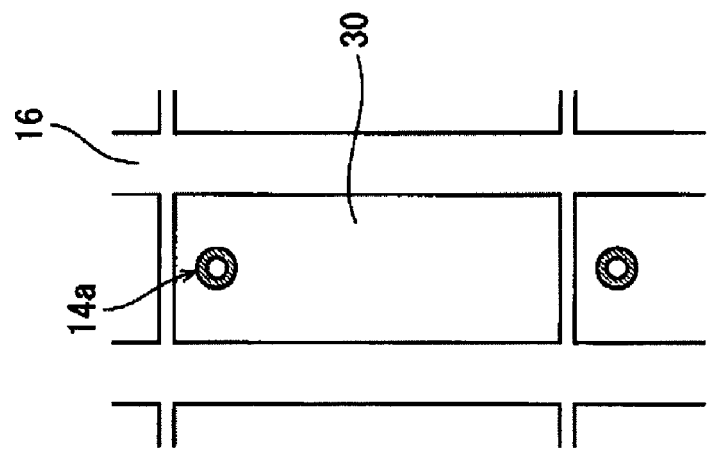
FIGS. 6A, 6B, and 6C are schematic diagrams of a distribution of luminescence brightness in an aperture according to Embodiment 1 of the present invention.
Figure 6B:
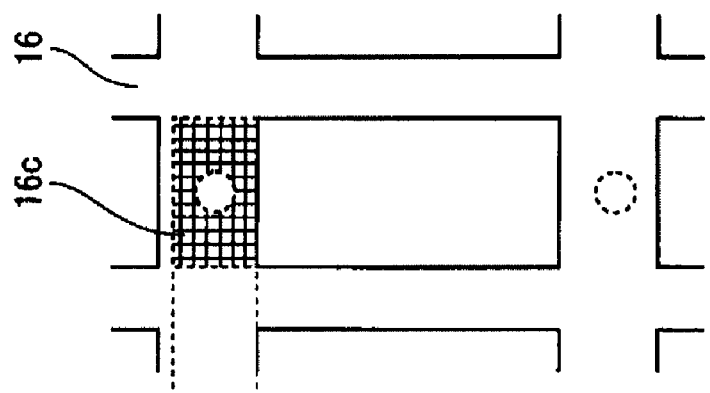
Figure 6A:
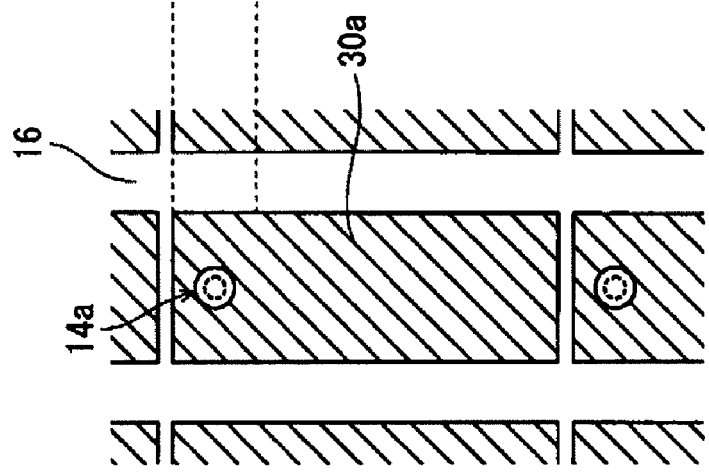

The following is a supplementary explanation, with reference to FIGS. 6A-6C, of the advantageous effects of the above structure in Embodiment 1.

FIG. 6A is a top view schematically showing an aperture 30a and the surrounding area in Embodiment 1 of the present invention, and FIG. 6B is a top view schematically showing a conventional aperture and the surrounding area.

The hatched area in the aperture 30a in FIG. 6A represents a section in which luminescence brightness does not decrease, since the light-emitting layer 17 is formed to a regular film thickness. By contrast, a light-emitting layer 17b and light-emitting layer 17a are layered in the section inside the contact hole upper periphery 14a that is not hatched, i.e. the section corresponding to the contact hole region 14g. Compared to the region other than the contact hole region 14g, the film thickness is thicker in this section, the electric field is smaller, and luminescence brightness decreases. However, the surface area of this section, which corresponds to the contact hole region 14g in the aperture 30a, is minute as compared to the surface area corresponding to the region other than the contact hole region 14g. Even if luminescence brightness decreases in this minute area, irregular light emission is not conspicuous.

Furthermore, as compared to the conventional aperture shown in FIG. 6B, the aperture 30a in FIG. 6A allows for a large surface area in which luminescence brightness does not decrease. This surface area corresponds to the lattice 16c in FIG. 6B (since the contact hole is conventionally buried under the bank, the lattice 16c is the section corresponding to the area that is occupied by the bank, minus the contact hole). Accordingly, the aperture ratio in the organic EL display panel 1 can be improved over a conventional display panel.

FIG. 6C is a top view schematically showing an aperture 30 and the surrounding area when a contact hole is simply provided inside the aperture without adopting the structure in Embodiment 1.

The hatched area in FIG. 6C corresponds to the inner region 14f near the contact hole upper periphery 14a shown in FIG. 3. In this section, the light-emitting layer 17a has a thinner film thickness than usual, as described above, and therefore due to concentration of the electric field, the luminescence brightness is higher than usual. An increase in luminescence brightness is visible even in a minute area, and therefore irregular light emission in this section ends up being conspicuous.

<Manufacturing Method>

FIGS. 7A-7E and 8A-8F are process drawings to illustrate a manufacturing method of an organic EL display panel according to Embodiment 1 of the present invention.

The following description focuses particularly on the organic EL cell 20b and organic EL cell 20a in the organic EL display panel 1.

The process is composed of a first step through an eighth step.

The first step through the fifth step are common to the organic EL cell 20a and organic EL cell 20b and are represented in FIGS. 7A-7E. FIGS. 8A-8C represent the sixth step through the eighth step for the organic EL cell 20a, whereas FIGS. 8D-8F represent the sixth step through the eighth step for the organic EL cell 20b.

Figure 7A:
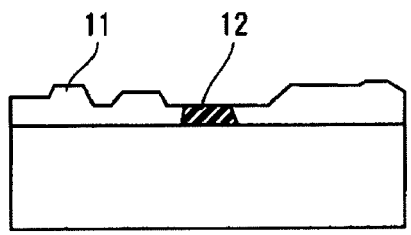
FIGS. 7A-7E are process drawings to illustrate a manufacturing method of an organic EL display panel according to Embodiment 1 of the present invention.
Figure 8A:
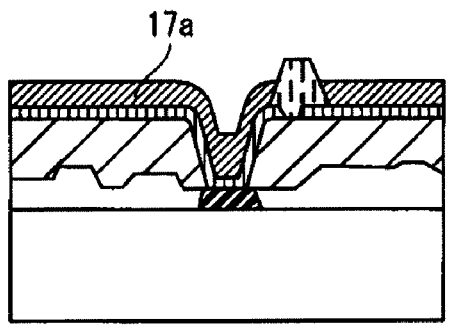
FIGS. 8A-8F are process drawings to illustrate a manufacturing method of an organic EL display panel according to Embodiment 1 of the present invention (continued from FIGS. 7A-7E).
Figure 8D:
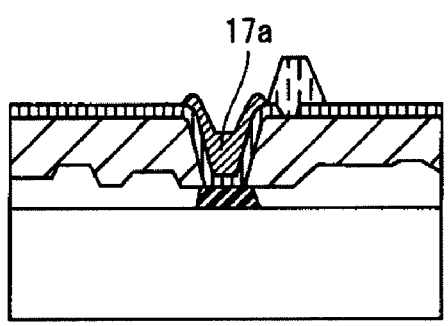
Figure 8B:
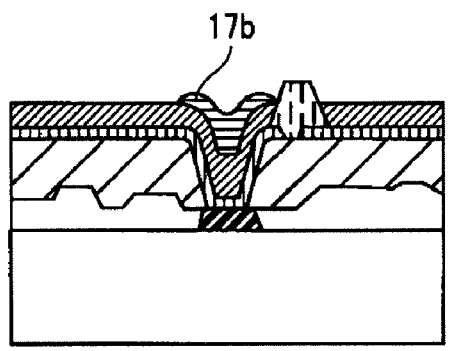
Figure 8E:
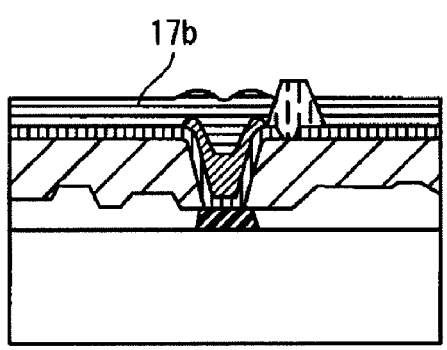
Figure 8C:
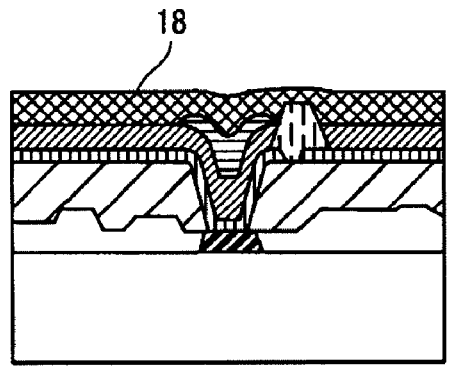
Figure 8F:
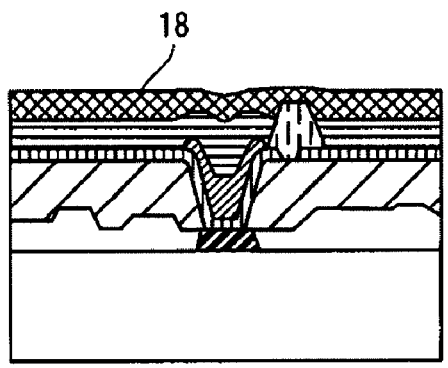

First, as shown in FIG. 7A, in the first step, the TFT layer 11 is formed above the substrate 10.

Figure 7B:
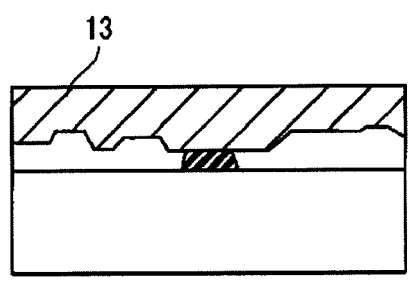

Next, as shown in FIG. 7B, the second step is to form the interlayer insulation film 13 on the TFT layer 11.

Figure 7C:
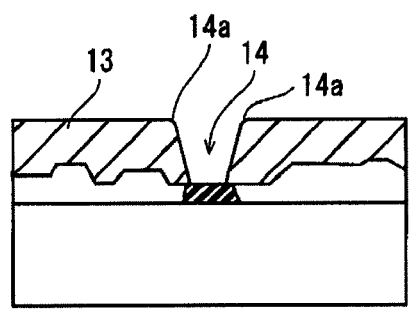

Next, as shown in FIG. 7C, the third step is to form a contact hole 14 corresponding to a pixel by etching the interlayer insulation film 13.

Figure 7D:
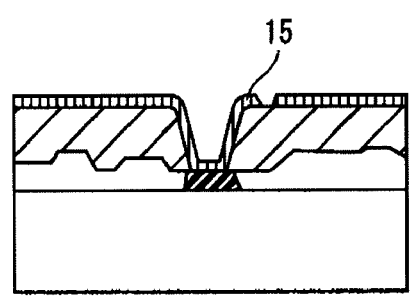

Next, as shown in FIG. 7D, the fourth step is to form a thin Ag film via sputtering on the interlayer insulation film 13, and then form the first electrodes 15 as a matrix in units of pixels by, for example, patterning the thin Ag film via photolithography. Note that the thin Ag film may be formed by vacuum deposition or the like.

Figure 7E:
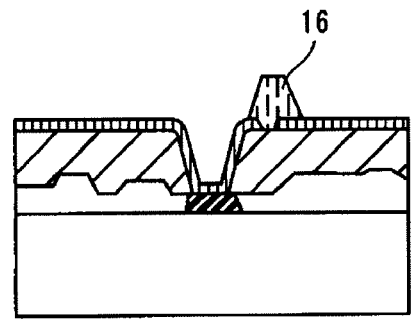

Next, as shown in FIG. 7E, the fifth step is to form a bank material layer on the first electrode 15 and the interlayer insulation film 13 and remove part of the bank material layer to form the bank 16 having apertures 30. The bank material layer may be formed, for example, by performing coating or the like. The bank material layer is removed by forming a resist pattern on the bank material layer and performing etching.

Next, the sixth step is to drip an ink composition (hereinafter, simply "ink") containing organic EL material into the region defined by the bank 16 in an organic EL cell 20 via, for example, the ink jet method. In this case, the organic EL material has an emission color of R.

In the sixth step, in the organic EL cell 20a with an emission color of R, ink is dripped in the entire region defined by the bank to form the light-emitting layer 17a, as shown in FIG. 8A.

On the other hand, in the organic EL cell 20b with an emission color of G, ink corresponding to R is only dripped in the contact hole region 14g to form the light-emitting layer 17a, as shown in FIG. 8D.

Next, the ink in the light-emitting layer 17a is dried, and subsequently, the seventh step is to drip ink into the contact hole region 14g of the organic EL cell 20a to form the light-emitting layer 17b, as shown in FIG. 8B. The emission color of the organic EL material in the seventh step is G.

Also, ink is dripped into the entire region defined by the bank in the organic EL cell 20b to form the light-emitting layer 17b, as shown in FIG. 8E. To form the light-emitting layer 17, ink may be dripped by the dispenser method, nozzle coating method, spin coat method, intaglio printing, letter-press printing, etc.

Next, the eighth step is to form a thin ITO film that will be the second electrode 18 via, for example, sputtering (FIG. 8C, FIG. 8F).

Note that, though not shown in the figures, for the organic EL cell 20c with an emission color of B, the light-emitting layer 17a is formed in the sixth step by dripping ink corresponding to R in the contact hole region 14g; in the seventh step, ink corresponding to G is not dripped; and after the seventh step, ink corresponding to B is dripped in the entire region defined by the bank to form the light-emitting layer 17c.

3. Embodiment 2

Structure

In Embodiment 1, the light-emitting layer 17 (17a, 17b) in each organic EL cell is formed with two light-emitting layers of different colors. By contrast, Embodiment 2 differs from Embodiment 1 in that three light-emitting layers with different colors are formed.

An organic EL display panel in Embodiment 2 has the same plan view as Embodiment 1.

Figure 9:
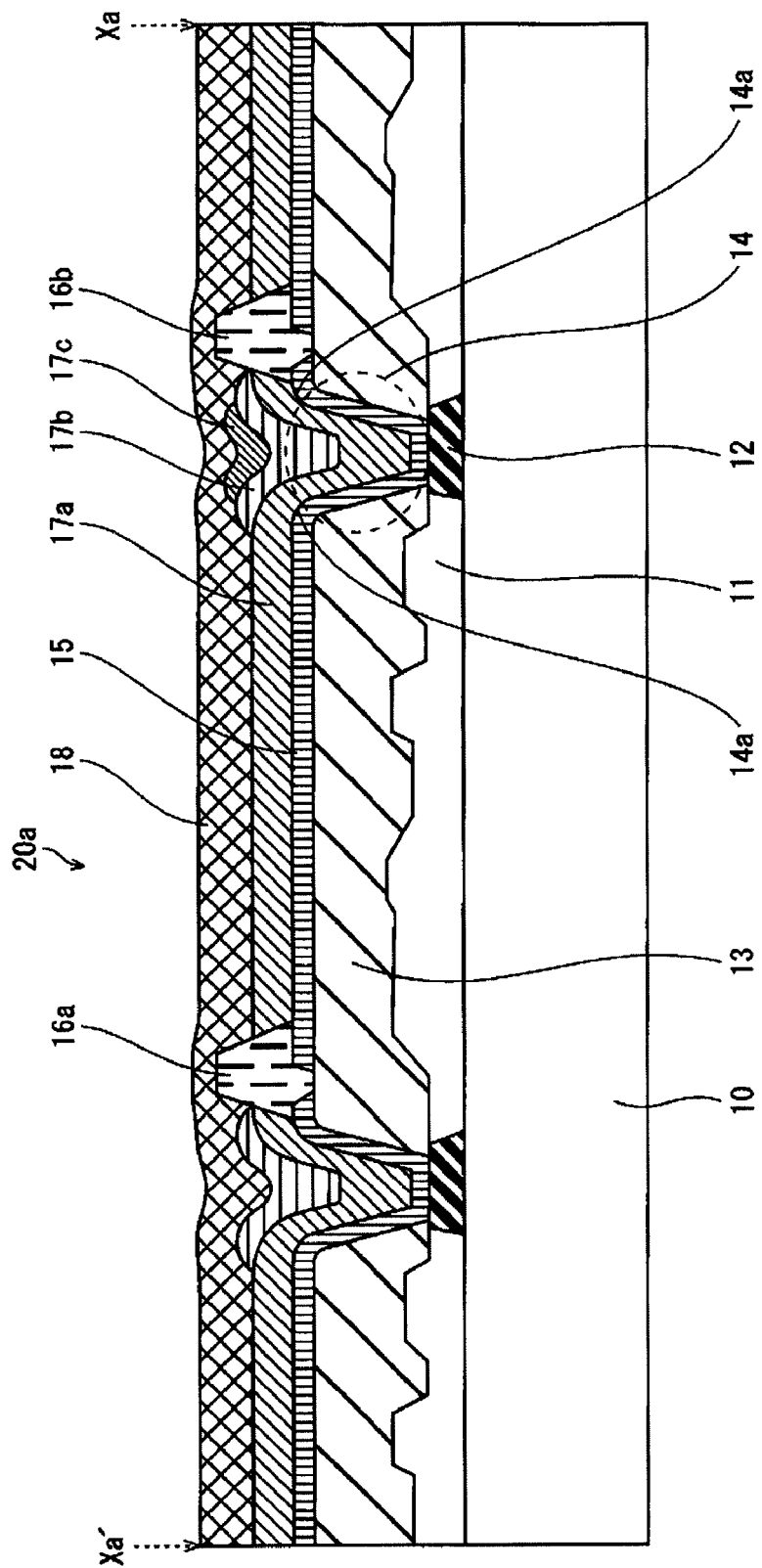
FIG. 9 is a cross-section diagram schematically showing a cross-section of an organic EL display panel according to Embodiment 2 of the present invention, focusing on a green organic EL cell.

FIG. 9 is a cross-section diagram schematically showing a cross-section (Xa-Xa' in FIG. 1) of an organic EL display panel 1 according to Embodiment 2, focusing on an organic EL cell 20a with an emission color of R.

Figure 10:
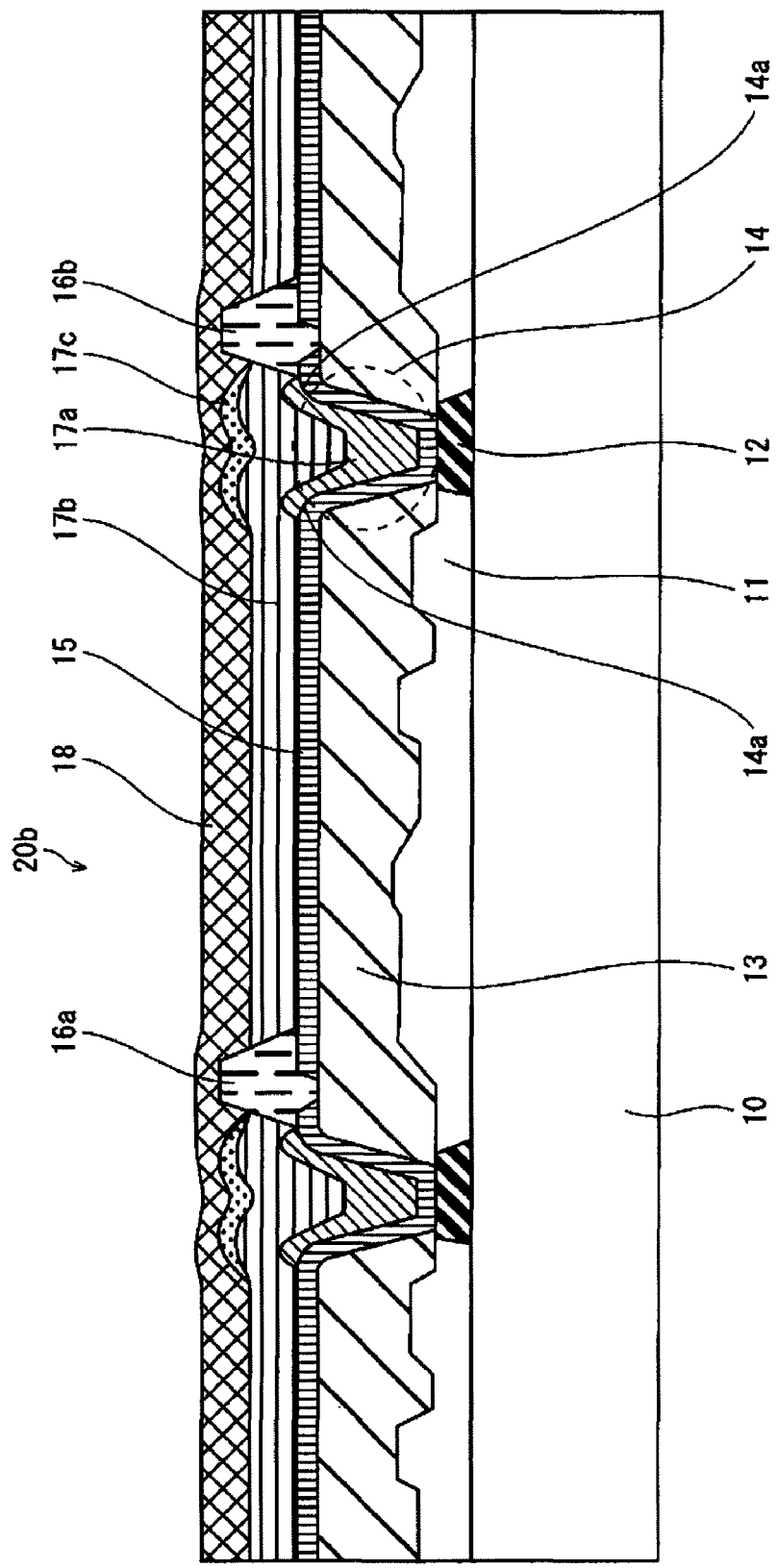
FIG. 10 is a cross-section diagram schematically showing a cross-section of an organic EL display panel according to Embodiment 2 of the present invention, focusing on a red organic EL cell.

FIG. 10 is a cross-section diagram schematically showing a cross-section (Xb-Xb' in FIG. 1) of the organic EL display panel 1 according to Embodiment 2, focusing on an organic EL cell 20b with an emission color of G.

Figure 11:
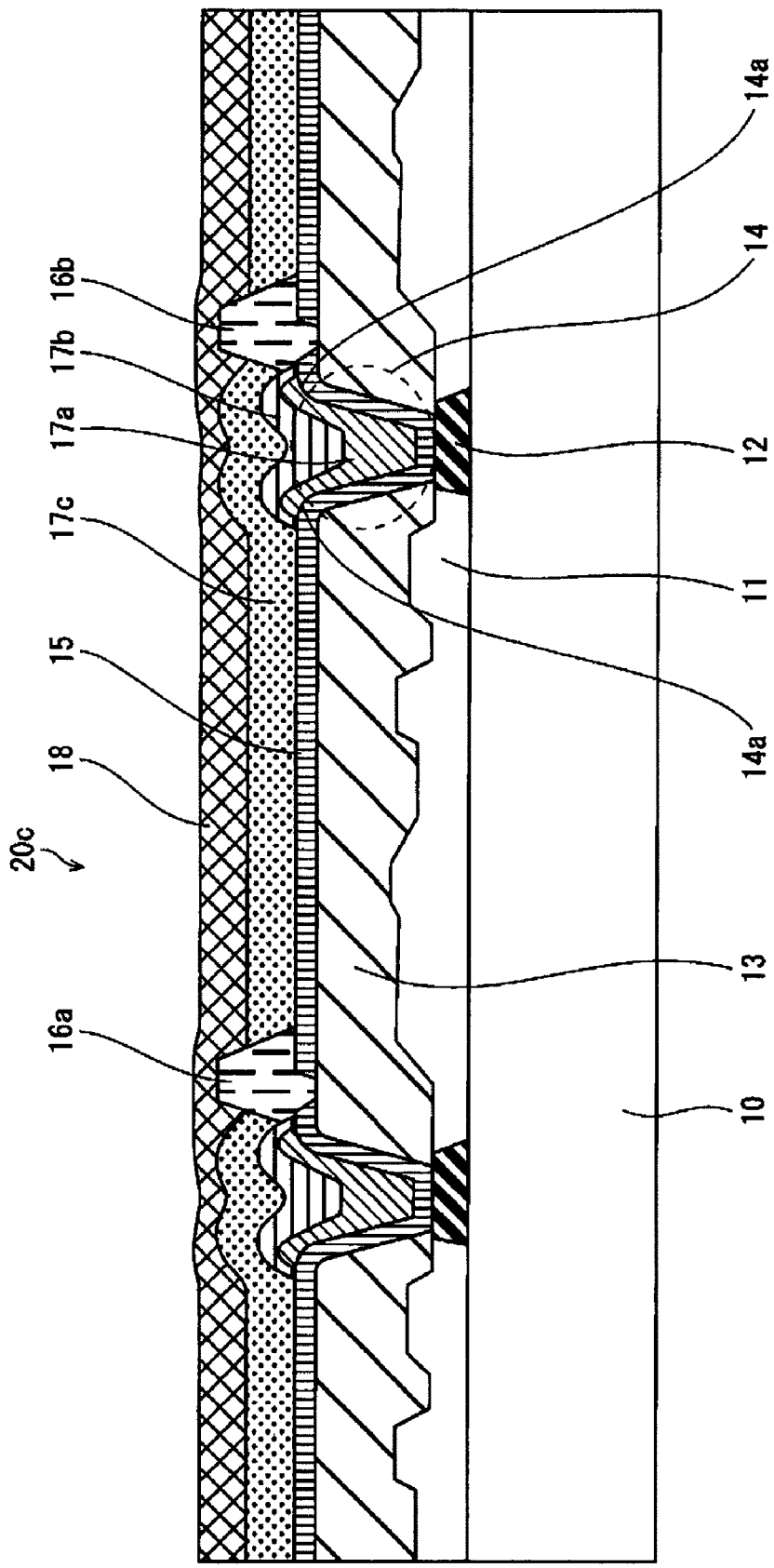
FIG. 11 is a cross-section diagram schematically showing a cross-section of an organic EL display panel according to Embodiment 2 of the present invention, focusing on a blue organic EL cell.

FIG. 11 is a cross-section diagram schematically showing a cross-section (Xc-Xc' in FIG. 1) of the organic EL display panel 1 according to Embodiment 2, focusing on an organic EL cell 20c with an emission color of B.

The substrate 10, TFT layer 11, power supply electrode 12, interlayer insulation film 13, contact hole 14, first electrodes 15, bank 16, and second electrode 18 in FIGS. 9, 10, and 11 do not differ from the elements described in FIG. 2.

In each of the organic EL cells 20a, 20b, and 20c in FIGS. 9, 10, and 11, the light-emitting layer 17 is formed by layering the light-emitting layer 17a, 17b, and 17c in this order on the first electrode 15 (hereinafter, in Embodiment 2, the light-emitting layers 17a, 17b, and 17c formed in the region defined by the bank are collectively referred to as the light-emitting layer 17).

However, in each of the organic EL cells 20a, 20b, and 20c in FIGS. 9, 10, and 11, one of the light-emitting layer 17a (corresponding to R), light-emitting layer 17b (corresponding to G), and light-emitting layer 17c (corresponding to B) differs from the other two by being a main light-emitting layer that covers the entire region defined by the bank 16. The emission color of the main light-emitting layer becomes the pixel color of the organic EL cell in which the main light-emitting layer is located. In the organic EL cell 20a, the light-emitting layer 17a is the main light-emitting layer; in the organic EL cell 20b, the light-emitting layer 17b is the main light-emitting layer; and in the organic EL cell 20c, the light-emitting layer 17c is the main light-emitting layer. The light-emitting layers among the light-emitting layers 17a, 17b, and 17c other than the main light-emitting layer (hereinafter, "sub-light-emitting layers") are only layered in the contact hole region 14g, unlike the main light-emitting layer. The total film thickness of the light-emitting layer 17a, light-emitting layer 17b, and light-emitting layer 17c layered on the contact hole region 14g should be thicker than the film thickness of the light-emitting layer layered in a region other than the contact hole region 14g. Normally, the film thickness of the light-emitting layer 17 in the contact hole region 14g is preferably on the order of 50-200 nm.

Advantageous Effects of the Structure in Embodiment 2

With the above-described structure, Embodiment 2 offers the same advantageous effects as described for Embodiment 1 with reference to FIG. 5. Embodiment 2 differs from Embodiment 1 in that light-emitting layers 17a, 17b, and 17c of three colors are layered on the contact hole region 14g. Therefore, as compared to a region other than the contact hole region 14g, the light-emitting layer 17 in the contact hole region 14g is formed to a thicker film thickness.

<Manufacturing Method>

The following describes a manufacturing method of the organic EL display panel 1 according to Embodiment 2.

The following description focuses particularly on the organic EL cells 20a, 20b, and 20c in the organic EL display panel 1.

The manufacturing process in Embodiment 2 is composed of a first step through a ninth step.

The first step through the fifth step are common to the organic EL cells 20a, 20b, and 20c and are the same as the steps represented by FIGS. 7A-7E in Embodiment 1; therefore, a description thereof is omitted.

FIGS. 12A-12D represent the sixth step through the ninth step for the organic EL cell 20a, FIGS. 12E-12H represent the sixth step through the ninth step for the organic EL cell 20b, and FIGS. 13A-13D represent the sixth step through the ninth step for the organic EL cell 20c.

The sixth step is to layer the light-emitting layer 17a, color R, on the first electrode 15.

Figure 12A:
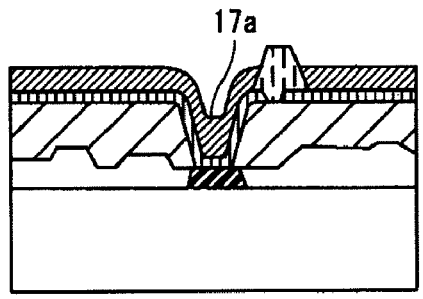
FIGS. 12A-12H are process drawings to illustrate a manufacturing method of an organic EL display panel according to Embodiment 2 of the present invention.

In the organic EL cell 20a, the light-emitting layer 17a, color R, is layered as the main light-emitting layer on the entire region defined by the bank 16 as shown in FIG. 12A. On the other hand, in the organic EL cells 20b and 20c, the light-emitting layer 17a is layered as a sub-light-emitting layer only in the contact hole region 14g, as shown in FIGS. 12E and 13E.

Next, the seventh step is to layer the light-emitting layer 17b on the light-emitting layer 17a.

Figure 12E:
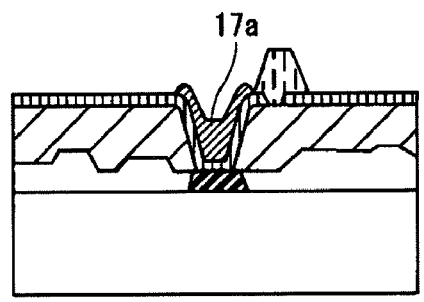
Figure 12B:
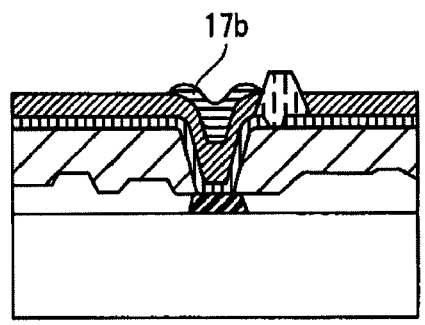
Figure 12F:
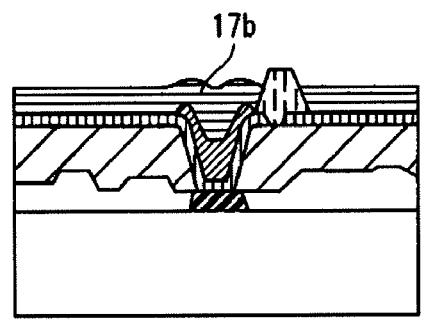

In the organic EL cell 20a, the light-emitting layer 17b is layered as a sub-light-emitting layer only in the contact hole region 14g, as shown in FIG. 12B.

In the organic EL cell 20b, the light-emitting layer 17b is layered as the main light-emitting layer in the entire region defined by the bank, as shown in FIG. 12E.

Figure 13A:
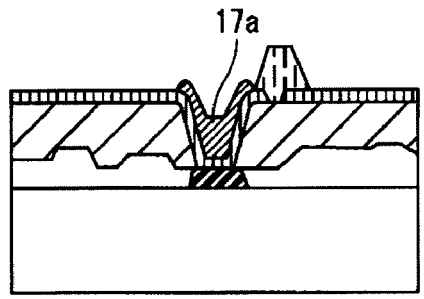
FIGS. 13A-13D are process drawings to illustrate a manufacturing method of an organic EL display panel according to Embodiment 2 of the present invention (continued from FIGS. 12A-12H).
Figure 13B:
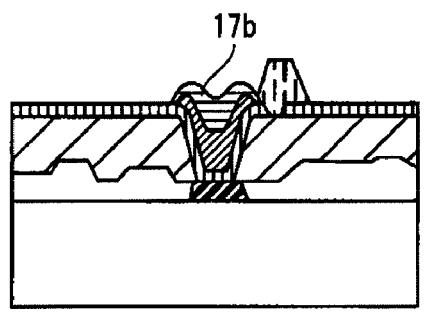

In the organic EL cell 20c, as in the organic EL cell 20a, the light-emitting layer 17b is layered as a sub-light-emitting layer only in the contact hole region 14g, as shown in FIG. 13B.

Next, the eighth step is to layer the light-emitting layer 17c on the light-emitting layer 17b.

Figure 12C:
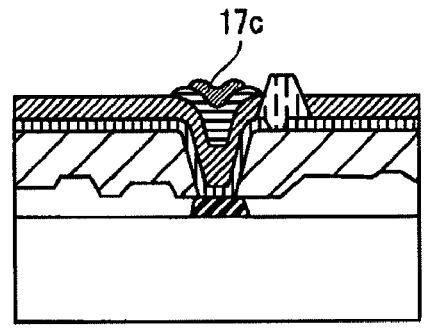
Figure 12G:
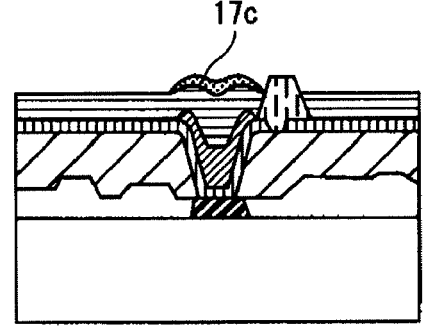

In the organic EL cells 20a and 20b, the light-emitting layer 17c is layered as a sub-light-emitting layer only in the contact hole region 14g, as shown in FIGS. 12C and 12G.

Figure 13C:
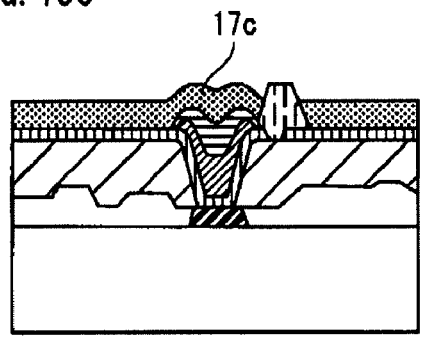

In the organic EL cell 20c, the light-emitting layer 17c is layered as the main light-emitting layer in the entire region defined by the bank, as shown in FIG. 13C.

Figure 12D:
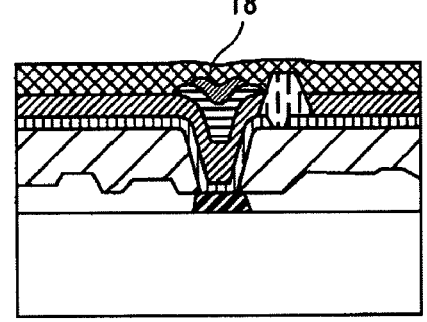
Figure 12H:
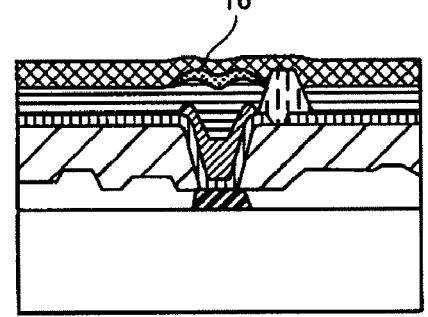
Figure 13D:
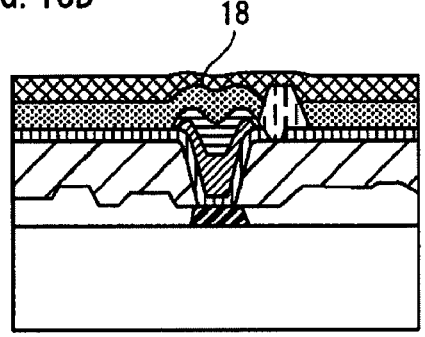

After the eighth step is complete, the ninth step is to form a thin ITO film that will be the second electrode 18 on the light-emitting layer 17 via sputtering, for example, as shown in FIGS. 12D, 12G, and 13D.

This concludes the description of the manufacturing method.

4. Modifications

Note that the organic EL display panel in the present invention is not limited to the examples illustrated above; it is of course possible to modify the organic EL display panel in a variety of ways without departing from the scope of the present invention.

(1) Addition of an Intermediate Layer (IL Layer) and Electron Injection Layer In addition to the structure described in the above Embodiments, each organic EL cell may be provided with an IL layer 41 between the first electrode 15 and the light-emitting layer 17, and with an electron injection layer 42 between the light-emitting layer 17 and the second electrode 18.

Figure 14:
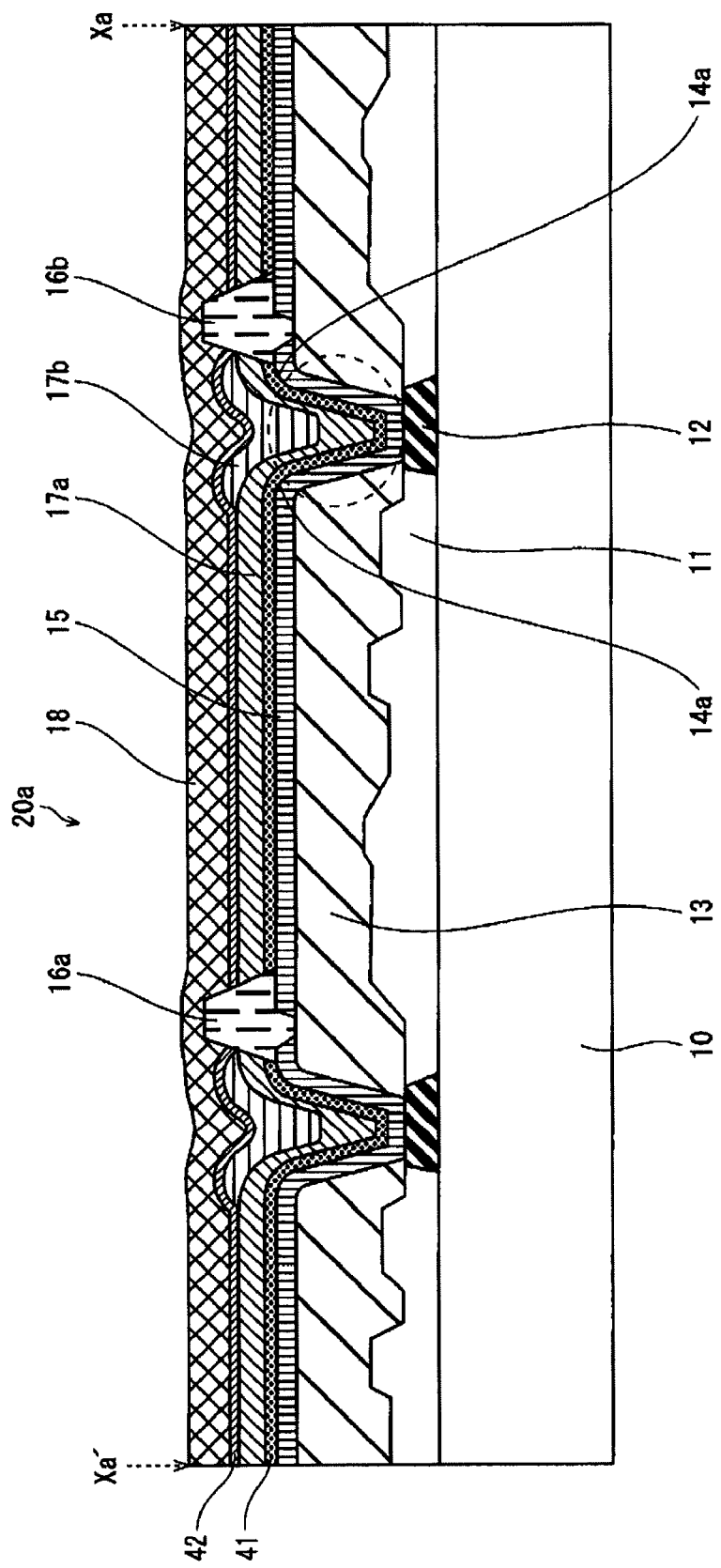
FIG. 14 is a cross-section diagram schematically showing part of an organic EL display panel that is provided with an IL layer and electron injection layer according to a Modification of the present invention.

FIG. 14 shows the organic EL cell 20b in Embodiment 1, shown in FIG. 2, when provided with the IL layer 41 and the electron injection layer 42.

Figure 15:
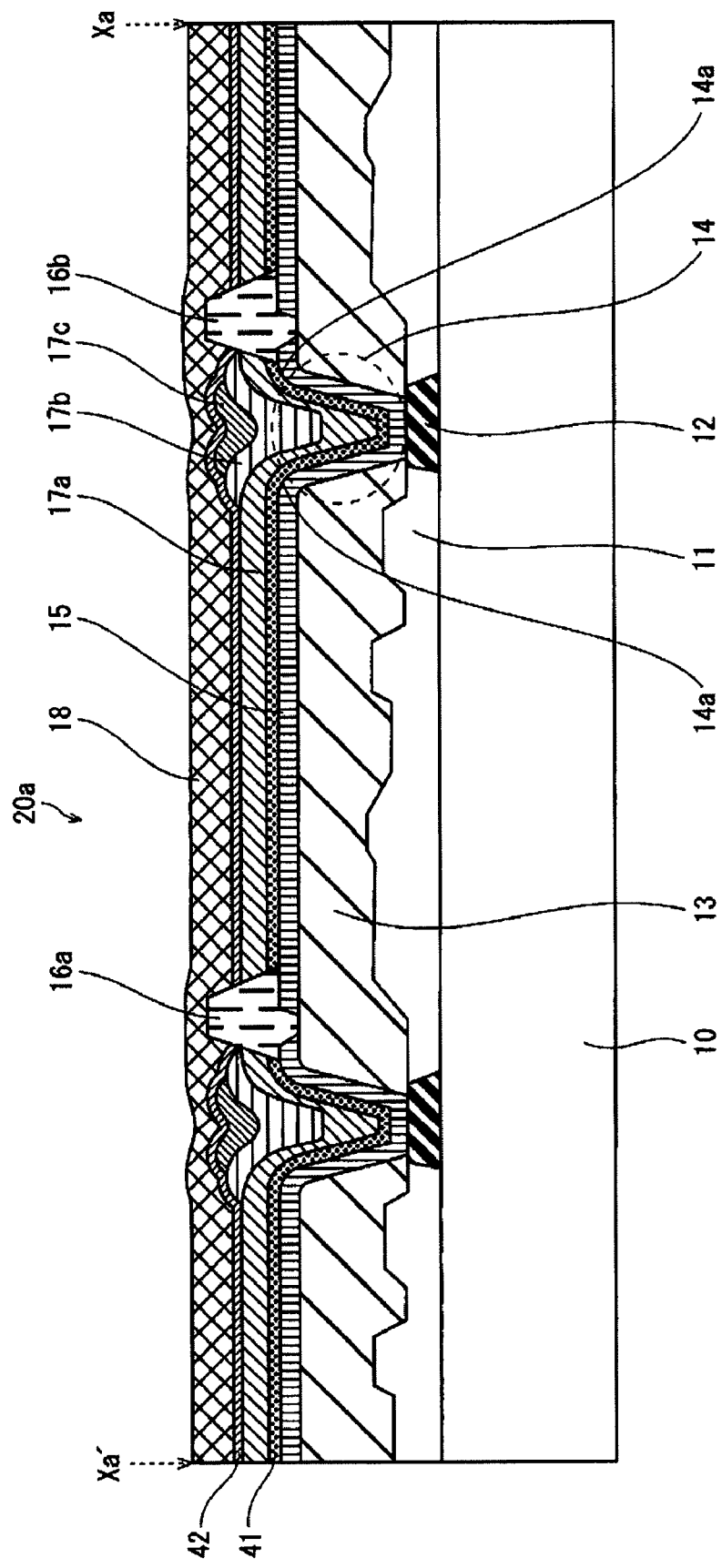
FIG. 15 is a cross-section diagram schematically showing part of an organic EL display panel that is provided with an IL layer and electron injection layer according to the Modification of the present invention.

FIG. 15 shows the organic EL cell 20b in Embodiment 2, shown in FIG. 9, when provided with the IL layer 41 and the electron injection layer 42.

FIGS. 14 and 15 share the same description; therefore, in the following description, FIG. 14 serves to represent both figures.

The IL layer 41 is formed with an indium tin oxide (ITO) layer and a hole injection layer layered thereon.

The ITO layer exists between the first electrode 15 and the hole injection layer and has the function of guaranteeing excellent bondability between the first electrode 15 and the hole injection layer.

The hole injection layer is formed with WOx (tungsten oxide) or MoxWyOz (molybdenum tungsten oxide). By providing a hole injection layer, holes can be easily injected, contributing to effective light emission by electrons in the light-emitting layer 17, which allows for excellent light-emitting characteristics to be obtained. The hole injection layer should be formed with a metal compound that fulfills the function of hole injection. Examples of such a metal compound include a metal oxide, metal nitride, or metal oxynitride.

The electron injection layer 42 has a function to transport electrons injected through the second electrode 18 to the light-emitting layer 17 and is formed, for example, of barium, phthalocyanine, lithium fluoride, or a combination thereof.

In the manufacturing method, the IL layer 41 is formed between the fourth step and the fifth step.

The IL layer 41 is formed by forming a thin ITO film via, for example, sputtering, and then forming the ITO layer by patterning the thin ITO film via photolithography, for example. Subsequently, using a composition containing WOx or MoxWyOz, a thin film of WOx or MoxWyOz is formed by technology such as vacuum deposition, sputtering, etc.

The electron injection layer 42 is formed between the seventh step and the eighth step (in the case of FIG. 15, between the eighth step and the ninth step).

The electron injection layer is formed after the seventh step (in the case of FIG. 15, after the eighth step) by forming a thin barium film that will be the electron injection layer 7 via, for example, vacuum deposition.

(2) Using a Line Bank

Figure 16:
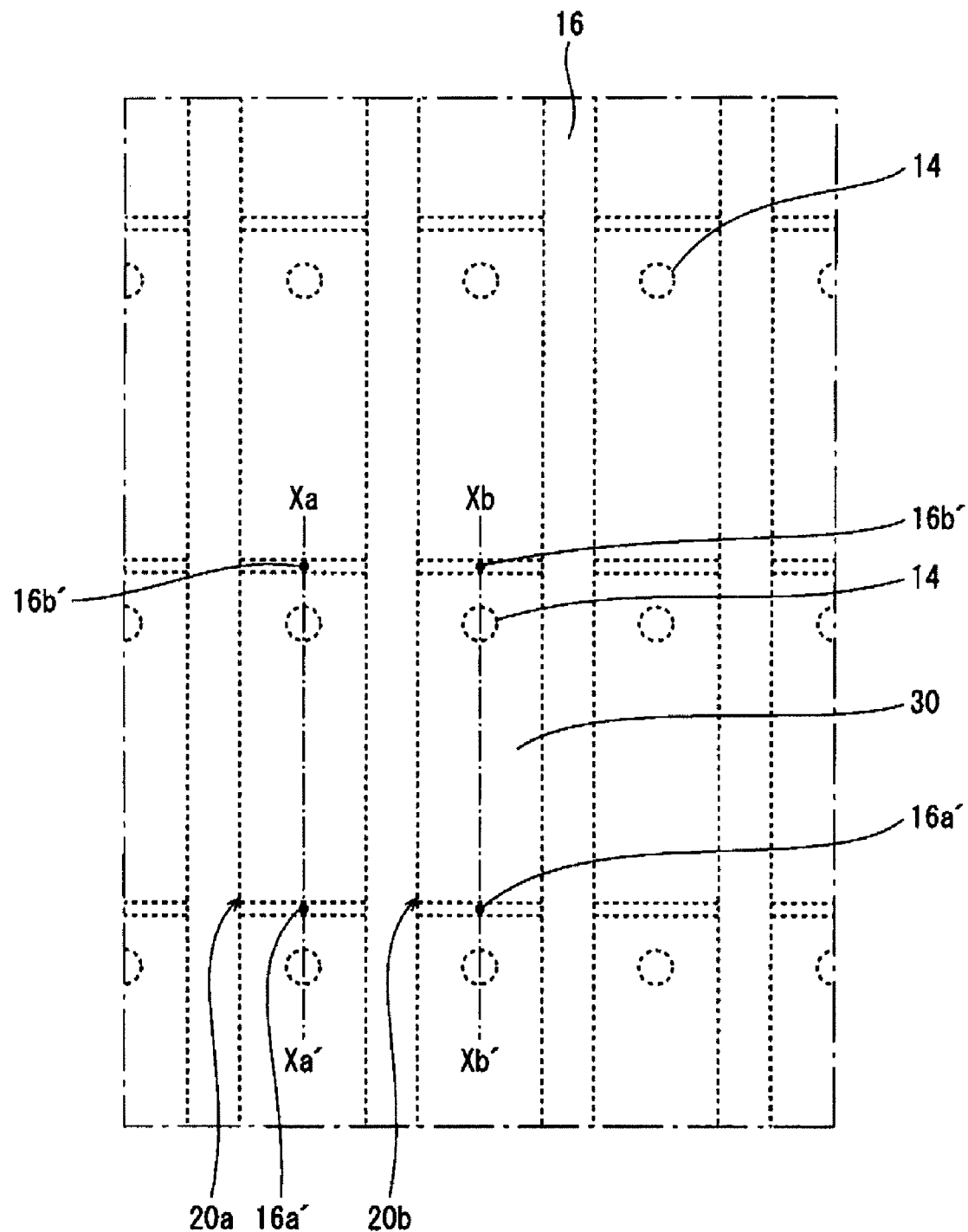
FIG. 16 is a plan view schematically showing part of an organic EL display panel with a line bank according to another Modification of the present invention.

In Embodiments 1 and 2 and the Modifications thereof, the bank 16 has been described as a pixel bank, but the line bank shown in FIG. 16 may be adopted in the present invention.

Unlike the above-described pixel bank, a line bank does not completely surround a light-emitting laminate, but rather defines two opposing sides of the light-emitting laminate. In the case of a line bank, the bank 16 is formed to partition a plurality of pixels by column or by row. In other words, the bank 16 exists only as columns or as rows on either side of a light-emitting layer 17, and a light-emitting layer 17 is continuous with other light-emitting layers 17 in the same column or row.

Figure 17:
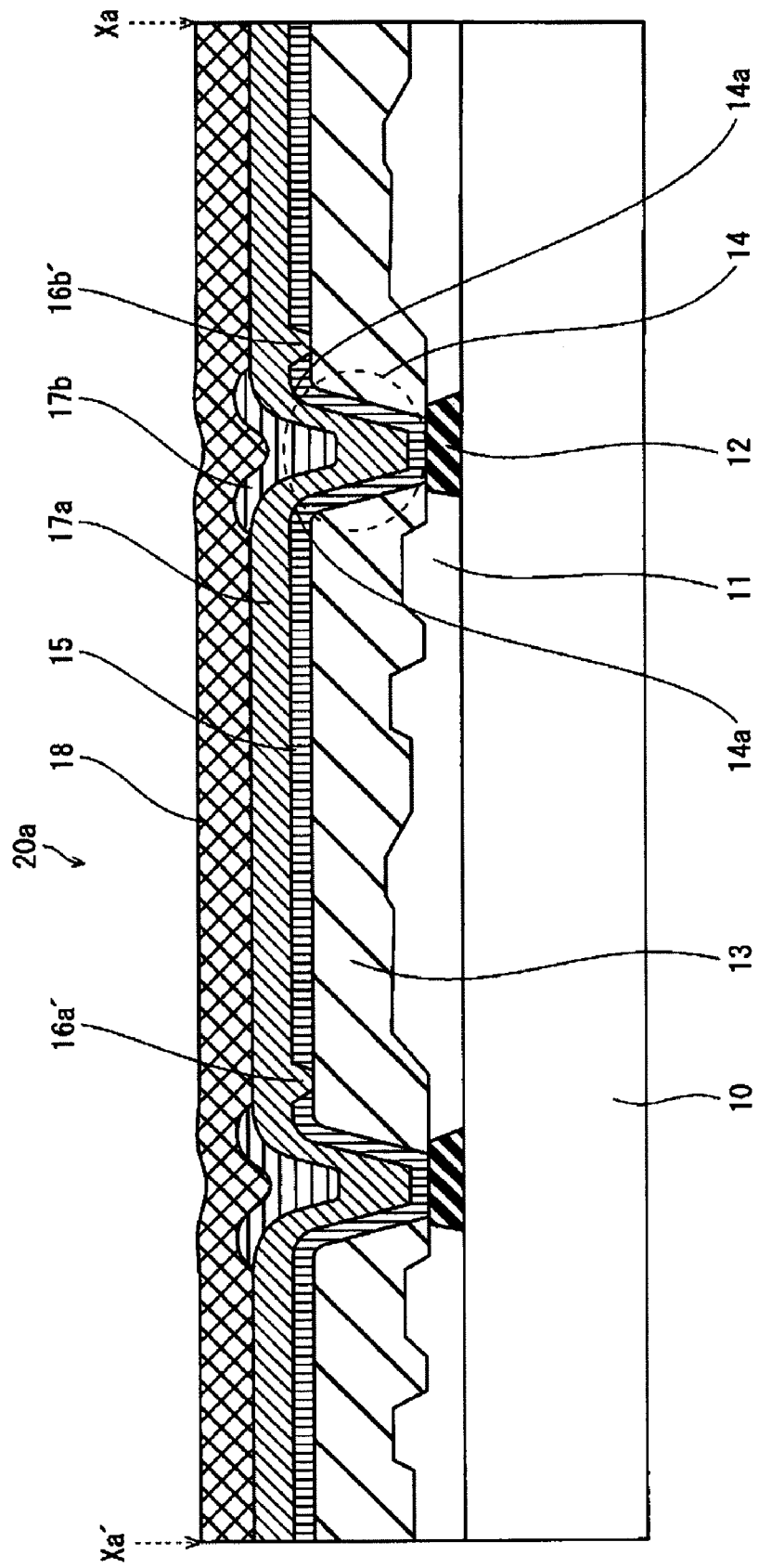
FIG. 17 is a cross-section diagram schematically showing a cross-section of an organic EL display panel according to the other Modification of the present invention, focusing on a green organic EL cell.

FIG. 17 is a cross-section diagram showing an organic EL cell 20b according to Embodiment 1 when a line bank structure is adopted.

In FIG. 17, no bank exists in sections (16a' and 16b') where the bank 16a and 16b exists in the organic EL cell 20b with a pixel bank in FIG. 2.

Figure 18:
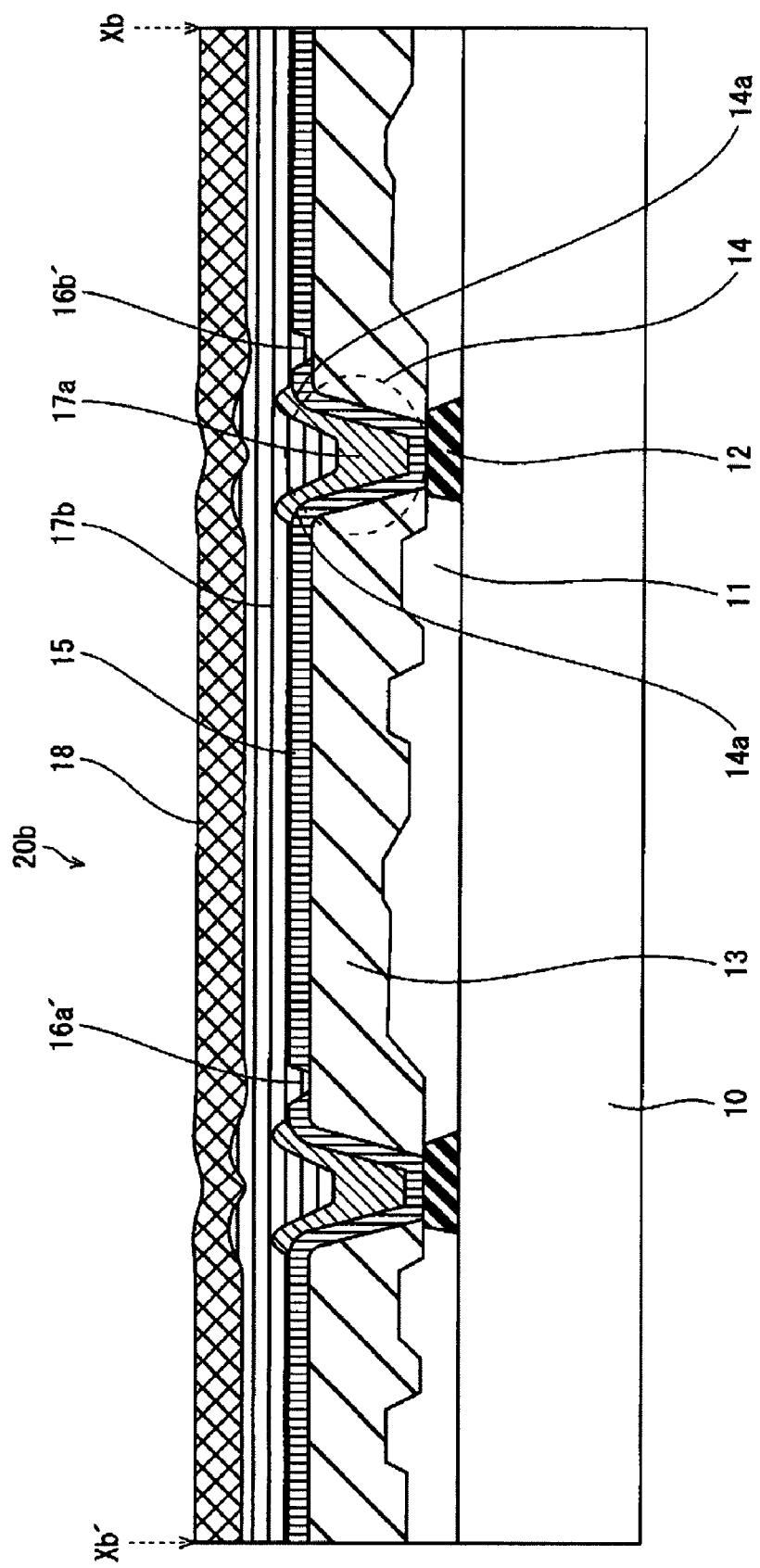
FIG. 18 is a cross-section diagram schematically showing a cross-section of an organic EL display panel according to the other Modification of the present invention, focusing on an organic EL cell of a second color.

FIG. 18 is a cross-section diagram showing an organic EL cell 20b according to Embodiment 2 when a line bank structure is adopted.

In FIG. 18, no bank exists in sections (16a' and 16b') where the bank 16a and 16b exists in the organic EL cell 20b with a pixel bank in FIG. 9.

(3) Top-Emission Type Cells

In the above Embodiments, top-emission type cells are described, but the present invention is not limited in this way; the cells may be bottom-emission type.

(4) The Bank

In the above Embodiments, a bank is used, but when using a bank, an electric field may concentrate at the edge of the first electrode 15, or the first electrode 15 and second electrode 18 may short out. To avoid these problems, instead of using a bank, the first electrode 15 may be covered with an insulating film in sections corresponding to the bank.

(5) The Contact Holes

Figure 19:
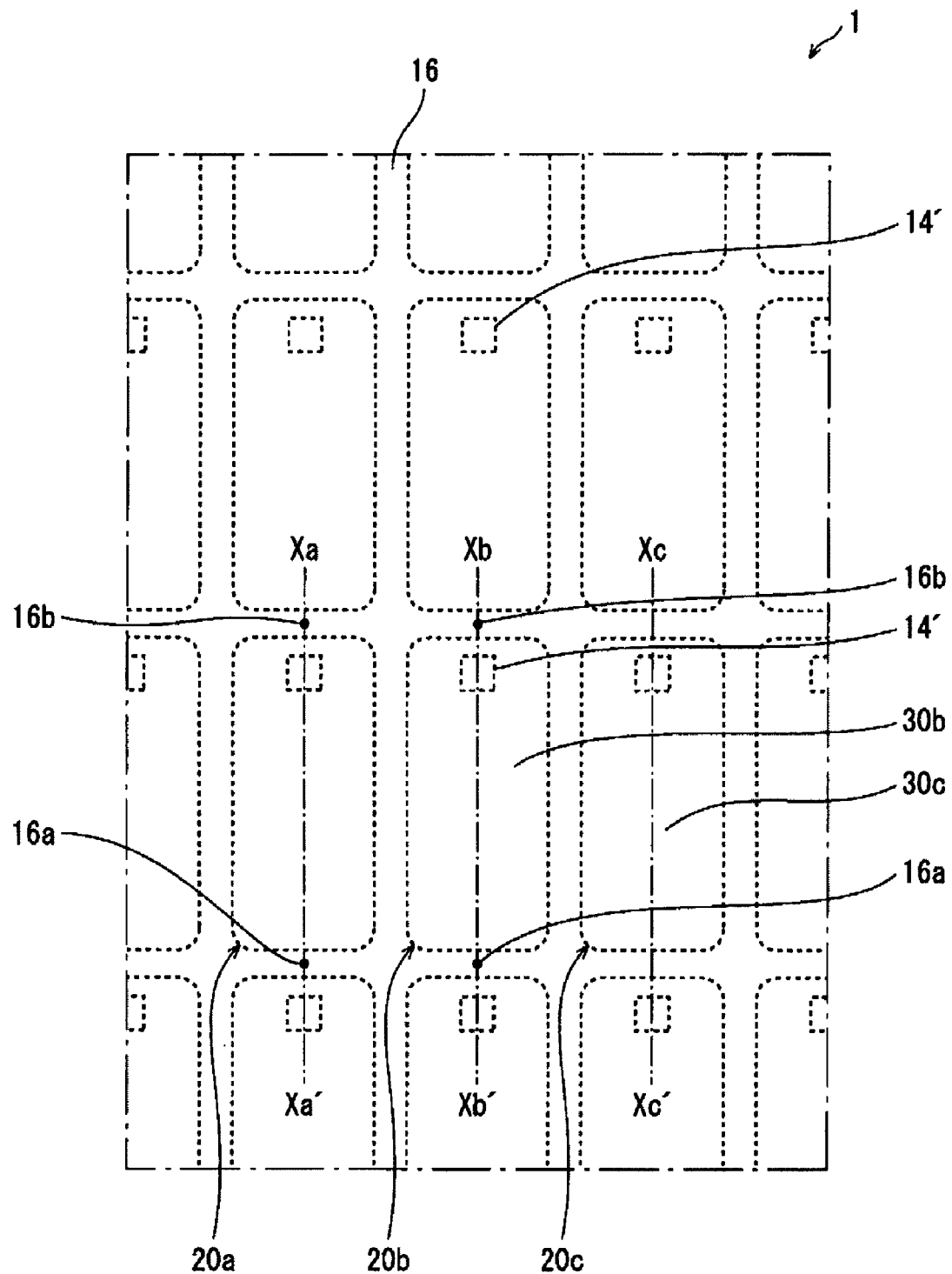
FIG. 19 is a plan view schematically showing part of an organic EL display panel having contact holes (square holes) according to yet another Modification of the present invention.

In the above Embodiments, the contact holes are described as being circular in shape, but the present invention is not limited in this way; the contact holes may be through-holes. For example, the contact holes may be square, like the contact holes 14' in FIG. 19.

(6) The Organic EL Display Panel

An organic EL display panel 1 according to an aspect of the present invention, or an organic EL display panel according to one of the Modifications, may be mounted in a display device 100.

Figure 20:
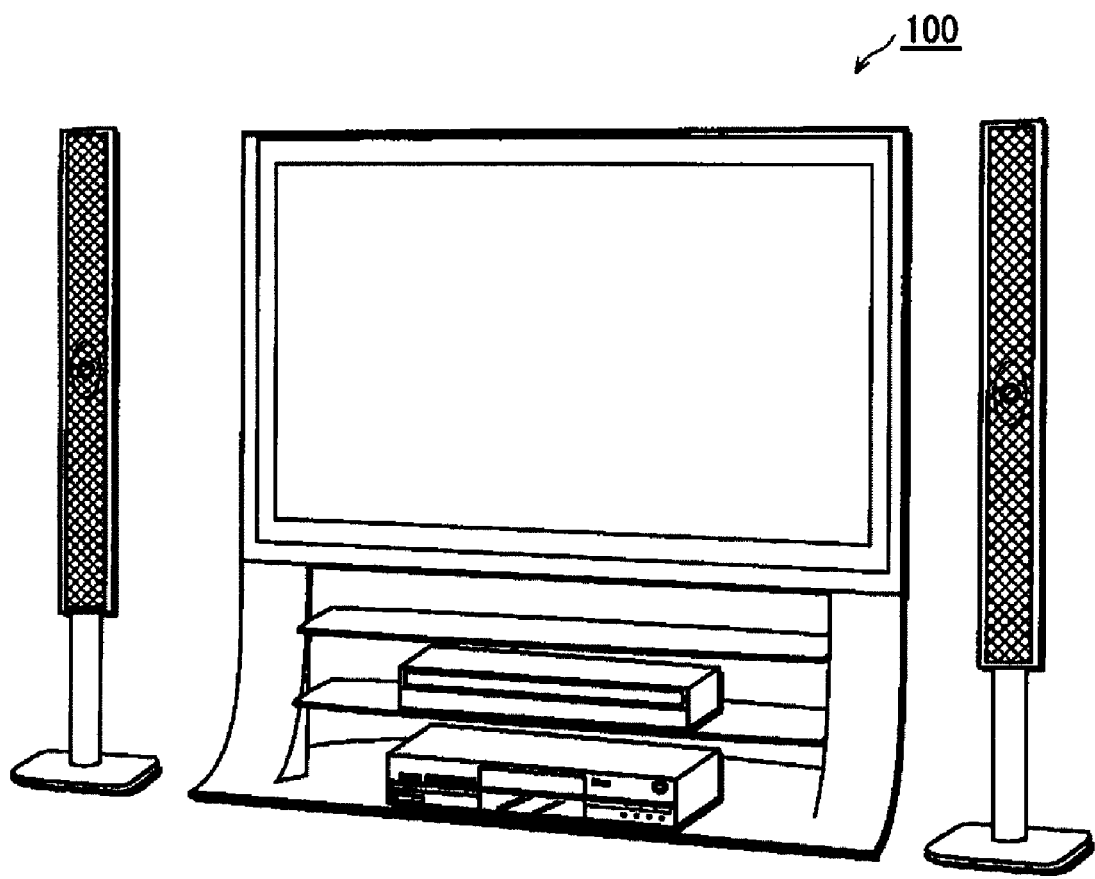
FIG. 20 is an external perspective view of a display device according to yet another Modification of the present invention.

FIG. 20 is an external perspective view of the display device 100.

An organic EL display device with the same advantageous effects as described above can thus be constructed.

(7) Embodiments and Modifications

The above Embodiments and Modifications may be combined with one another.

INDUSTRIAL APPLICABILITY

The organic EL display panel in the present invention has high light takeoff efficiency and is appropriate as a display element such as a cellular telephone display, a television, etc., or in a variety of light sources.

What is claimed is:

1. An organic EL display panel including pixels, each of the pixels corresponding to one of a plurality of colors, the organic EL display panel comprising:
   a thin film transistor layer;
   an interlayer insulation film on the thin film transistor layer and including a plurality of contact holes, each of the plurality of contact holes corresponding to one of the pixels;
   a plurality of first electrodes formed on the interlayer insulation film, each being conductive with the thin film transistor layer via one of the plurality of contact holes and corresponding to one of the pixels;
   a bank being a grid and defining a plurality of apertures, at least one of the plurality of apertures corresponding to each of the plurality of colors, at least one of the plurality of contact holes beneath each of the plurality of apertures;
   a first organic light-emitting layer disposed in each of the plurality of apertures that corresponds to at least one of the pixels of a first color of the plurality of colors;
   a second organic light-emitting layer disposed in each of the plurality of apertures that corresponds to at least one of the pixels of a second color of the plurality of colors; and
   a second electrode formed above the first organic light-emitting layer and the second organic light-emitting layer, wherein
   in each of the plurality of apertures in which the first organic light-emitting layer is disposed, a first contact hole region is above each of the plurality of contact holes,
   in each of the plurality of apertures in which the second organic light-emitting layer is disposed, a second contact hole region is above each of the plurality of contact holes, and
   a first-material layer comprising a material the same as a material of the first organic light-emitting layer and a second-material layer comprising a material the same as a material of the second organic light-emitting layer are superimposed in the first contact hole region and the second contact hole region.

2. The organic EL display panel of claim 1, wherein
the second-material layer is superimposed on the first-material layer in the first contact hole region and the second contact hole region.

3. The organic EL display panel of claim 1, wherein
in each of the plurality of apertures in which the first organic light-emitting layer is disposed, a film thickness in the first contact hole region, in which the second-material layer is superimposed, is greater than a film thickness of the first organic light-emitting layer disposed in a region other than the first contact hole region, and
in each of the plurality of apertures in which the second organic light-emitting layer is disposed, a film thickness in the second contact hole region, in which the first-material layer is superimposed, is greater than a film thickness of the second organic light-emitting layer disposed in a region other than the second contact hole region.

4. The organic EL display panel of claim 1, further comprising:
   a third organic light-emitting layer disposed in each of the plurality of apertures that corresponds to at least one of the pixels of a third color of the plurality of colors, wherein
   the second electrode is formed above the first organic light-emitting layer, the second organic light-emitting layer, and the third organic light-emitting layer,
   in each of the plurality of apertures in which the third organic light-emitting layer is disposed, a third contact hole region is above each of the plurality of contact holes, and
   the first-material layer, the second-material layer, and a third-material layer comprising a material the same as a material of the third organic light-emitting layer are superimposed in the first contact hole region, the second contact hole region, and the third contact hole region.

5. The organic EL display panel of claim 4, wherein
the third-material layer is superimposed on the second-material layer which is superimposed on the first-material layer in the first contact hole region, the second contact hole region, and the third contact hole region.

6. The organic EL display panel of claim 4, wherein
in each of the plurality of apertures in which the first organic light-emitting layer is disposed, a film thickness in the first contact hole region, in which the first-material layer, the second-material layer, and the third-material layer are superimposed, is greater than a film thickness of the first organic light-emitting layer disposed in a region other than the first contact hole region,
in each of the plurality of apertures in which the second organic light-emitting layer is disposed, a film thickness in the second contact hole region, in which the first-material layer, the second-material layer, and the third-material layer are superimposed, is greater than a film thickness of the second organic light-emitting layer disposed in a region other than the second contact hole region, and
in each of the plurality of apertures in which the third organic light-emitting layer is disposed, a film thickness in the third contact hole region, in which the first-material layer, the second-material layer, and the third-material layer are superimposed, is greater than a film thickness of the third organic light-emitting layer disposed in a region other than the third contact hole region.

7. The organic EL display panel of claim 4, wherein
the first color, the second color, and the third color are different ones of the plurality of colors, and
the first color, the second color, and the third color are each one of red, green, and blue.

8. The organic EL display panel of claim 1, wherein
the bank is the grid and defines the plurality of apertures in lines that each correspond to one of the plurality of colors.

9. The organic EL display panel of claim 1, wherein
each of the plurality of apertures corresponds to one of the pixels, one of the plurality of colors, and one of the plurality of first electrodes.

10. The organic EL display panel of claim 1, wherein
the first color and the second color are each one of red, green, and blue.

11. The organic EL display panel of claim 1, wherein
the interlayer insulation film is a planarizing film.

12. An organic EL display device comprising the organic EL display panel of claim 1.

13. A method of manufacturing an organic EL display panel including pixels, each of the pixels corresponding to one of a plurality of colors, the method comprising:
   forming a thin film transistor layer;
   forming an interlayer insulation film on the thin film transistor layer;

forming a plurality of contact holes in the interlayer insulation film, each of the plurality of contact holes corresponding to one of the pixels;

forming a plurality of first electrodes on the interlayer insulation film, each being conductive with the thin film transistor layer via one of the plurality of contact holes;

forming a bank as a grid that defines a plurality of apertures, at least one of the plurality of apertures corresponding to each of the plurality of colors, at least one of the plurality of contact holes beneath each of the plurality of apertures;

forming a first organic light-emitting layer in each of the plurality of apertures that corresponds to at least one of the pixels of a first color of the plurality of colors;

forming a second organic light-emitting layer in each of the plurality of apertures that corresponds to at least one of the pixels of a second color of the plurality of colors; and forming a second electrode above the first organic light-emitting layer and the second organic light-emitting layer, wherein in each of the plurality of apertures, a first contact hole region is above each of the plurality of contact holes, and a first-material layer comprising a material the same as a material of the first organic light-emitting layer and a second-material layer comprising a material the same as a material of the second organic light-emitting layer are superimposed in the contact hole region.

14. The method of manufacturing the organic EL display panel of claim 13, wherein the second-material layer is superimposed on the first-material layer.

15. The method of manufacturing the organic EL display panel of claim 13, wherein in each of the plurality of apertures in which the first organic light-emitting layer is formed, a film thickness in the contact hole region, in which the second-material layer is superimposed, is greater than a film thickness of the first organic light-emitting layer formed in a region other than the contact hole region, and in each of the plurality of apertures in which the second organic light-emitting layer is formed, a film thickness in the contact hole region, in which the first-material layer is superimposed, is greater than a film thickness of the second organic light-emitting layer formed in a region other than the contact hole region.

16. The method of manufacturing the organic EL display panel of claim 13, wherein an ink jet method is used to form the first organic light-emitting layer and the second organic light-emitting layer.

17. The method of manufacturing the organic EL display panel of claim 16, wherein ink including an organic light-emitting material of the first color is dripped into each of the plurality of contact holes in each of the plurality of apertures in which the second organic light-emitting layer is formed when forming the first organic light-emitting layer, and ink including an organic light-emitting material of the second color is dripped into each of the plurality of contact holes in each of the plurality of apertures in which the first organic light-emitting layer is formed when forming the second organic light-emitting layer.

18. The method of manufacturing the organic EL display panel of claim 17, wherein after the ink including the organic light-emitting material of the first color is dripped into each of the plurality of contact holes in each of the plurality of apertures in which the second organic light-emitting layer is formed when forming the first organic light-emitting layer, and before the ink including an organic light-emitting material of the second color is dripped into each of the plurality of contact holes in each of the plurality of apertures in which the first organic light-emitting layer is formed when forming the second organic light-emitting layer, the ink including the organic light-emitting material of the first color is dried.

19. The method of manufacturing the organic EL display panel of claim 13, further comprising:

forming a third organic light-emitting layer in each of the plurality of apertures that corresponds to at least one of the pixels of a third color of the plurality of colors after forming the second organic light-emitting layer and before forming the second electrode, wherein the second electrode is formed above the first organic light-emitting layer, the second organic light-emitting layer, and the third organic light-emitting layer, and the first-material layer, the second-material layer, and a third-material layer comprising a material the same as a material of the third organic light-emitting layer are superimposed in the contact hole region in each of the plurality of apertures in which one of the first organic light-emitting layer, the second organic light-emitting layer, and the third organic light-emitting layer is formed.

20. The method of manufacturing the organic EL display panel of claim 19, wherein in each of the plurality of apertures in which the first organic light-emitting layer is formed, a film thickness in the contact hole region, in which the first-material layer, the second-material layer, and the third-material layer are superimposed, is greater than a film thickness of the first organic light-emitting layer formed in a region other than the contact hole region, in each of the plurality of apertures in which the second organic light-emitting layer is formed, a film thickness in the contact hole region, in which the first-material layer, the second-material layer, and the third-material layer are superimposed, is greater than a film thickness of the second organic light-emitting layer formed in a region other than the contact hole region, and in each of the plurality of apertures in which the third organic light-emitting layer is formed, a film thickness in the contact hole region, in which the first-material layer, the second-material layer, and the third-material layer are superimposed, is greater than a film thickness of the third organic light-emitting layer formed in a region other than the contact hole region.

21. The method of manufacturing the organic EL display panel of claim 19, wherein an ink-jet method is used to form the first organic light-emitting layer, the second organic light-emitting layer, and the third organic light-emitting layer.

22. The method of manufacturing the organic EL display panel of claim 21, wherein ink including an organic light-emitting material of the first color is dripped into each of the plurality of contact holes in each of the plurality of apertures in which one of the second organic light-emitting layer and the third organic light-emitting layer is formed when forming the first organic light-emitting layer, ink including an organic light-emitting material of the second color is dripped into each of the plurality of contact holes in each of the plurality of apertures in which one of the first organic light-emitting layer and the third light-emitting layer is formed when forming the second organic light-emitting layer, and ink including an organic light-emitting material of the third color is dripped into each of the plurality of contact holes in each of the plurality of apertures in which one of the first organic light-emitting layer and the second light-emitting layer is formed when forming the third organic light-emitting layer.

23. The method of manufacturing the organic EL display panel of claim 19, wherein the first color, the second color, and the third color are different ones of the plurality of colors, and the first color, the second color, and the third color are each one of red, green, and blue.

24. The method of manufacturing the organic EL display panel of claim 13, wherein the bank is formed as the grid that defines the plurality of apertures in lines that each correspond to one of the plurality of colors.

25. The method of manufacturing the organic EL display panel of claim 13, wherein each of the plurality of apertures corresponds to one of the pixels, one of the plurality of colors, and one of the plurality of first electrodes.

26. The method of manufacturing the organic EL display panel of claim 13, wherein the first color and the second color are each one of red, green, and blue.

* * * * *